(12) United States Patent
Van Kerschaver et al.

(10) Patent No.: US 11,711,053 B2
(45) Date of Patent: Jul. 25, 2023

(54) DYNAMICALLY ADJUSTABLE, FLEXIBLE, AND MODULAR PHOTOVOLTAIC SYSTEM AND METHOD

(71) Applicant: KING ABDULLAH UNIVERSITY OF SCIENCE AND TECHNOLOGY, Thuwal (SA)

(72) Inventors: Emmanuel P. Van Kerschaver, Thuwal (SA); Thomas G. Allen, Thuwal (SA); Michele De Bastiani, Thuwal (SA); Michael Filipe Salvador, Thuwal (SA); Ahmed Hesham Balawi, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 37 days.

(21) Appl. No.: 17/421,152

(22) PCT Filed: Nov. 20, 2019

(86) PCT No.: PCT/IB2019/059996
§ 371 (c)(1),
(2) Date: Jul. 7, 2021

(87) PCT Pub. No.: WO2020/157556
PCT Pub. Date: Aug. 6, 2020

(65) Prior Publication Data
US 2022/0085754 A1     Mar. 17, 2022

Related U.S. Application Data

(60) Provisional application No. 62/872,307, filed on Jul. 10, 2019, provisional application No. 62/797,686, filed on Jan. 28, 2019.

(51) Int. Cl.
*H01L 31/042* (2014.01)
*H02S 10/00* (2014.01)
(Continued)

(52) U.S. Cl.
CPC ............ *H02S 30/20* (2014.12); *H01L 31/048* (2013.01); *H02S 20/30* (2014.12)

(58) Field of Classification Search
CPC ......... H01R 35/02; H01R 12/62; H02S 30/20; H02S 40/36
(Continued)

(56) References Cited

U.S. PATENT DOCUMENTS

2010/0139742 A1  6/2010  Wayman et al.
2011/0214667 A1  9/2011  Baruh
(Continued)

FOREIGN PATENT DOCUMENTS

CH    706582 A1 * 12/2013 ................. F24J 2/36
FR    2525393 A1   10/1983
(Continued)

OTHER PUBLICATIONS

English machine translation of CH 706582 A1 (Year: 2023).*
(Continued)

*Primary Examiner* — Angelo Trivisonno
(74) *Attorney, Agent, or Firm* — Patent Portfolio Builders PLLC

(57) ABSTRACT

There is a dynamically adjustable photovoltaic (PV) system for transforming solar energy into electrical energy. The dynamically adjustable PV system includes a first PV fold including a first set of PV cells for generating electrical energy, and a first laminating film that encapsulates the first set of PV cells; a second PV fold including a second set of PV cells for generating electrical energy, and a second laminating film that encapsulates the second set of PV cells; and a connecting mechanism that connects the first laminating film to the second laminating film. The connecting mechanism includes a chamber.

20 Claims, 38 Drawing Sheets

(51) Int. Cl.
*H02S 30/00* (2014.01)
*H02S 30/20* (2014.01)
*H02S 20/30* (2014.01)
*H01L 31/048* (2014.01)

(58) Field of Classification Search
USPC .................................................. 136/245, 251
See application file for complete search history.

(56) References Cited

U.S. PATENT DOCUMENTS

| | | |
|---|---|---|
| 2012/0073623 A1 | 3/2012 | Jones et al. |
| 2014/0305493 A1 | 10/2014 | Dhir et al. |
| 2015/0083191 A1 | 3/2015 | Gmundner |
| 2015/0333565 A1 | 11/2015 | Korman |
| 2017/0063290 A1 | 3/2017 | Kurlagunda et al. |

FOREIGN PATENT DOCUMENTS

| | | | |
|---|---|---|---|
| FR | 2956774 A1 | 8/2011 | |
| JP | 2003318430 A | 11/2003 | |
| WO | 2012167291 A2 | 12/2012 | |
| WO | WO-2015038816 A1 * | 3/2015 | ......... H01L 31/0201 |

OTHER PUBLICATIONS

International Search Report in corresponding/related International Application No. PCT/IB2019/059996, dated Jul. 7, 2020.
Written Opinion of the International Searching Authority in corresponding/related International Application No. PCT/IB2019/059996, dated Jul. 7, 2020.

* cited by examiner

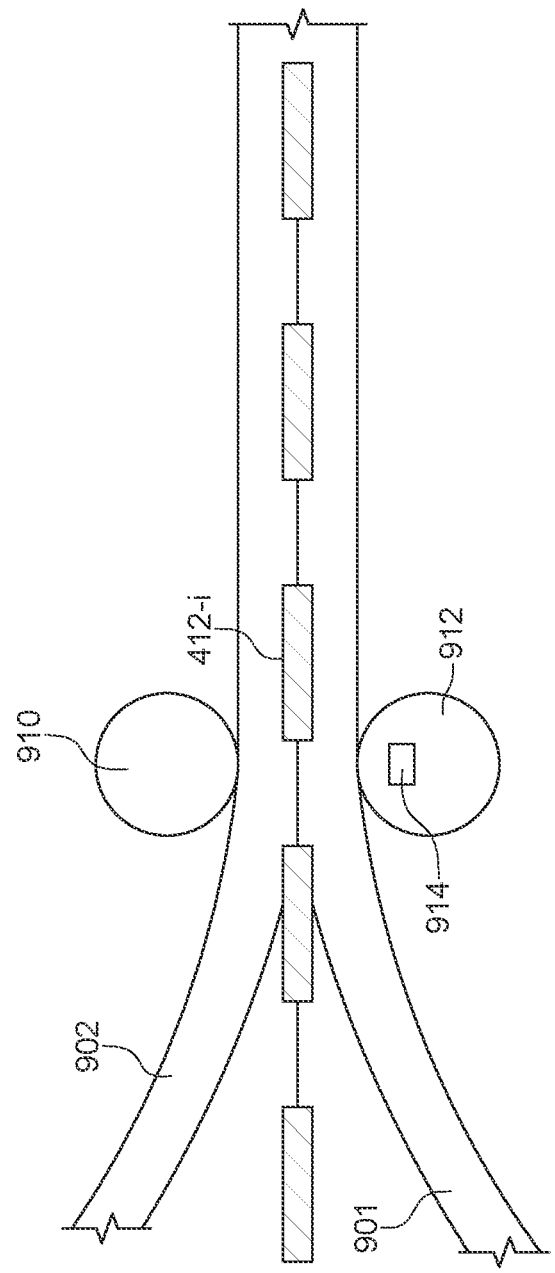

DYNAMICALLY ADJUSTABLE, FLEXIBLE, AND MODULAR PHOTOVOLTAIC SYSTEM AND METHOD

CROSS-REFERENCE TO RELATED APPLICATIONS

This application is a National Stage Application of International Application No. PCT/IB2019/059996, filed on Nov. 20, 2019, which claims priority to U.S. Provisional Patent Application No. 62/797,686, filed on Jan. 28, 2019, entitled "MECHANICALLY RETRACTABLE, FLEXIBLE, AND MODULAR PHOTOVOLTAIC SYSTEM AND METHOD," and U.S. Provisional Patent Application No. 62/872,307, filed on Jul. 10, 2019, entitled "MECHANICALLY RETRACTABLE, FLEXIBLE, AND MODULAR PHOTOVOLTAIC SYSTEM AND METHOD," the disclosures of which are incorporated herein by reference in their entirety.

BACKGROUND

Technical Field

Embodiments of the subject matter disclosed herein generally relate to a photovoltaic system that uses solar radiation for generating energy, and more specifically, to techniques and processes for controlling solar light and/or air that passes through the photovoltaic system, by using dynamically adjustable and flexible photovoltaic cell folds.

Discussion of the Background

Photovoltaic (PV) cells have become the fastest growing class of solar energy harvesting technologies. The typical PV module is based on silicon solar cells. A PV cell 100 traditionally includes, as shown in FIG. 1, a substrate layer 102 on which a specially treated semi-conductor layer 104 is formed (if crystalline silicon wafers are used, there is no need for the substrate). Additional layers 106 are formed on top of the semi-conductor layer 104 for charge extraction and/or as an anti-reflective coating layer. A top electrode 108 and a bottom electrode 110 are attached to the PV cell for collecting the charge generated by the semi-conductor layer 104 when exposed to solar irradiation 112.

The typical substrate layer 102 (e.g., glass) and the semi-conductor layer 104 are made of solid materials (e.g., silicon or silicon based materials) that make the entire cell to be rigid. Furthermore, because of the small amount of current and voltage that an individual solar cell generates, it is customary, as illustrated in FIG. 2, to connect together plural individual PV cells 100 and encapsulate them between a common solid back sheet 202 and a front glass (not shown), to form a PV cell module 200. The individual PV cells 100 are connected in series in FIG. 2, and two electrode pads 210 and 212 are provided at the end of the connections to output the generated current and voltage. The support 202 is generally made of a solid and opaque material so that no light can pass through it. There are modules on the market that use a non-opaque back sheet that makes the module to be transparent between the cells, but these modules are still rigid due to the glass front.

There are known PV systems 300 (used for example, for camping, Biard 100W system, sold under the trademark of Volkscamper in South Africa) that connect (electrically and mechanically) two or more solar cell modules 200 to each other, as shown in FIG. 3, for generating an increased amount of electrical power. FIG. 3 shows the system 300 having two solar cell modules 200 connected with a hinge 310 to each other. It is noted that the frame/substrate 202 of each module is solid, bulky and rigid. Furthermore, some support elements 312 are attached to the frame 202 for orienting the cells toward the sun. Various electronic components 314 are also shown to being connected to the solar cell modules.

However, such systems are bulky, heavy, difficult to fold and do not have a mechanical retraction system in place. In addition, those systems do not allow any control of the amount of solar light that can pass between the solar cells. Thus, there is need for a new PV system with superior mechanical properties, which can control not only the amount of current and/or voltage that is generated, but also the amount of solar light that passes through the PV system.

SUMMARY

According to an embodiment, there is a dynamically adjustable photovoltaic (PV) system for transforming solar energy into electrical energy. The PV system includes a first PV fold including a first set of PV cells for generating electrical energy, and a first laminating film that encapsulates the first set of PV cells, a second PV fold including a second set of PV cells for generating electrical energy, and a second laminating film that encapsulates the second set of PV cells, and a connecting mechanism that connects the first laminating film to the second laminating film. The connecting mechanism includes a chamber.

According to another embodiment, there is a photovoltaic (PV) fold for transforming solar energy into electrical energy, and the PV fold includes a set of PV cells electrically connected to each other; a laminating film that encapsulates the set of PV cells, where the laminating film has plural apertures; and plural cover parts, each cover part configured to fit into a corresponding aperture in the laminating film. The plural cover parts are made of a material different from a material of the laminating film.

According to still another embodiment, there is a dynamically adjustable photovoltaic (PV) system for transforming solar energy into electrical energy, and the PV system includes a first PV fold including a first set of PV cells for generating electrical energy, and a first laminating film that encapsulates the first set of PV cells; a second PV fold including a second set of PV cells for generating electrical energy, and a second laminating film that encapsulates the second set of PV cells; and a connecting mechanism that electrically connects the first set of PV cells to the second set of PV cells. The connecting mechanism is bendable so that the first PV fold folds over the second PV fold.

According to yet another embodiment, there is a method for dynamically adjusting a surface of a photovoltaic (PV) system. The method includes attaching the PV system to a structure, wherein the PV system includes a first PV fold including a first set of PV cells for generating electrical energy, and a second PV fold including a second set of PV cells for generating electrical energy; measuring a parameter associated with the structure; and adjusting, based on the parameter, the surface of the PV system so that at least one of (1) an electrical energy generation by the PV system, (2) a shade inside the structure, and (3) air penetration inside the structure is adjusted.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 9A-9D illustrate the PV system at various stages during the fabrication process;

FIG. 20 illustrates a flexible connecting mechanism that connects two PV folds and allow air and/or light to pass through;

FIGS. 23A and 23B illustrate a lamination film that encapsulates a PV fold and has holes for allowing air and/or light to pass through;

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a PV system that includes two PV folds. However, the embodiments discussed herein are not limited to two PV folds.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 4:
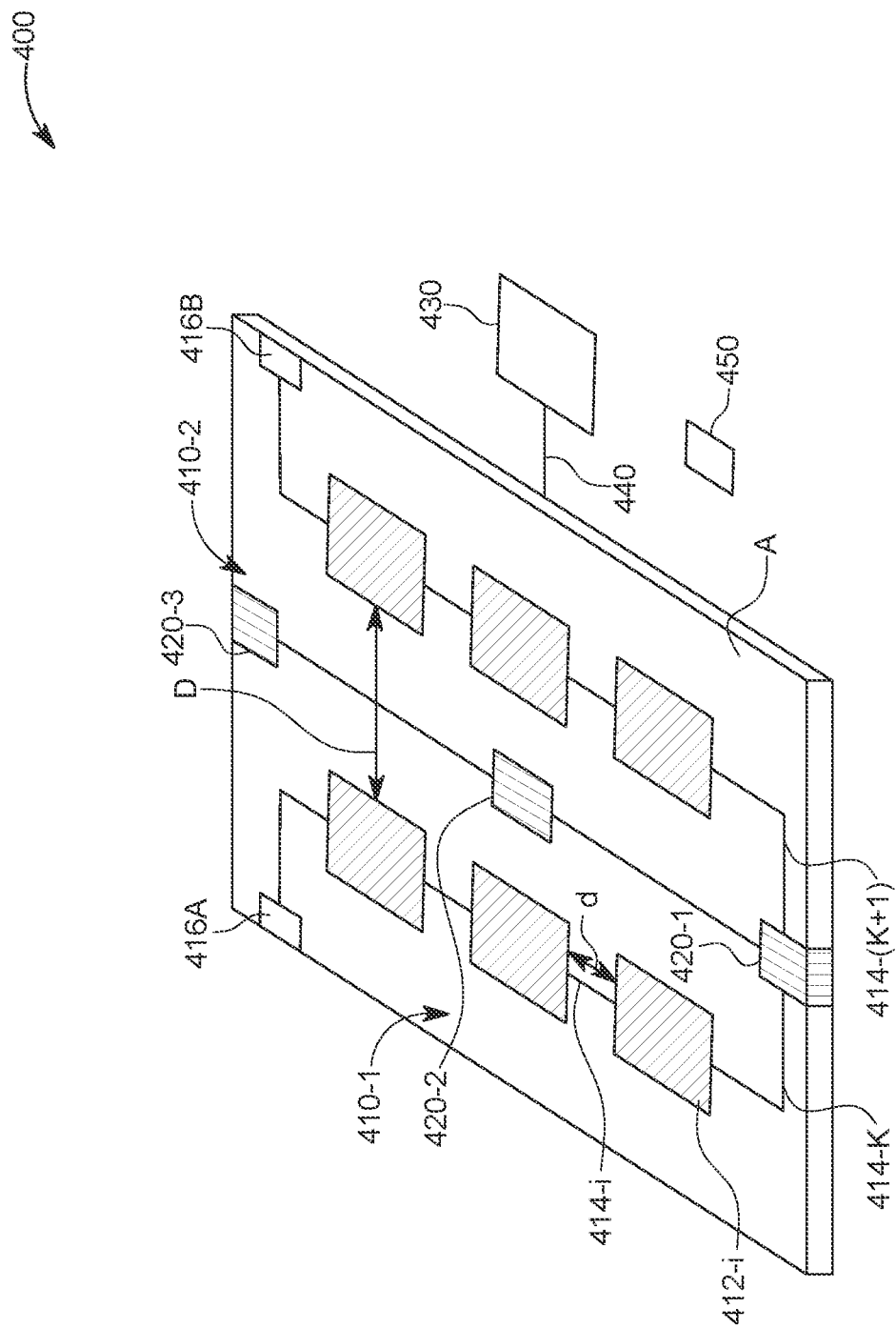
FIG. 4 illustrates a modular PV system.

According to an embodiment, there is a dynamic solar screen system 400 that includes foldable ('concertina'-shaped) photovoltaic folds 410-1 and 410-2 (generically referred to herein as 410-$i$) that are connected to each other via connecting mechanisms 420-1, 420-2 and 420-3 (generically referred to herein as 420-$i$), as illustrated in FIG. 4. FIG. 4 shows for simplicity only two PV folds and three hinges, but the embodiment may be implemented for any number of PV folds and any number of mechanical/electrical connecting mechanisms. The system 400 further includes an actuation mechanism 430 (generically illustrated in the figure, but more details would be provided in the following examples), which may include a motor, and a folding mechanism 440 (generically illustrated in the figures as a simple link, but more details would be provided in the following embodiments). The actuation mechanism 430 provides the necessary force to the folding mechanism 440 for folding or unfolding the plural PV folds 410-$i$. In addition, the PV system 400 may also include a controller 450 for controlling the folding and unfolding of the PV folds. Note that the PV folds are illustrated in FIG. 4 as being shaped as panels, but other shapes may be used for the PV folds.

FIG. 4 further shows that each fold 410-$i$ includes plural PV cells 412-$i$, and the PV cells are electrically connected to each other to form a string. Thus, a fold includes a string of cells that are encapsulated. For example, the PV cells in the embodiment of FIG. 4 are connected in series to each other. However, it is possible to connect the PV cells in parallel or in a combination of series and parallel. The electrical circuit formed by the PV cells and their interconnecting links 414-$i$ have two end pads 416A and 416B, where the voltage and current generated by the PV cells can be harvested. Note that although the interconnecting links 414-$i$ are illustrated as a single line, each interconnecting link can include one or more wires.

Regarding the connecting mechanism 420-$i$, in one application it can be implemented as an active or passive hinge. In another application, the hinge may be replaced by other materials, for example, a tape. In one embodiment, connecting mechanism 420-1 is active, i.e., it has an electrical path to which the interconnecting links 414-$k$ and 414-$(k+1)$ are electrically connected so that a current from one string passes to the other string, while connecting mechanism 420-2 is passive, i.e., it is not connected to any electrical element to pass current through its body. A structure of such connecting mechanisms is discussed later on in more detail.

A PV cell 412-$i$ may have any known structure. For example, the solar cell 412-$i$ may be based on crystalline, multi crystalline or amorphous silicon technology, but the exact cell technology may be different, for example, it may be copper indium gallium selenide (CIGS) cells, cadmium telluride (CdTe) cells, conventional top-cells or bifacial or any other emerging cell technology. The string of PV cells for each string 410-*i* can consist of variable numbers of solar cells.

Figure 5:
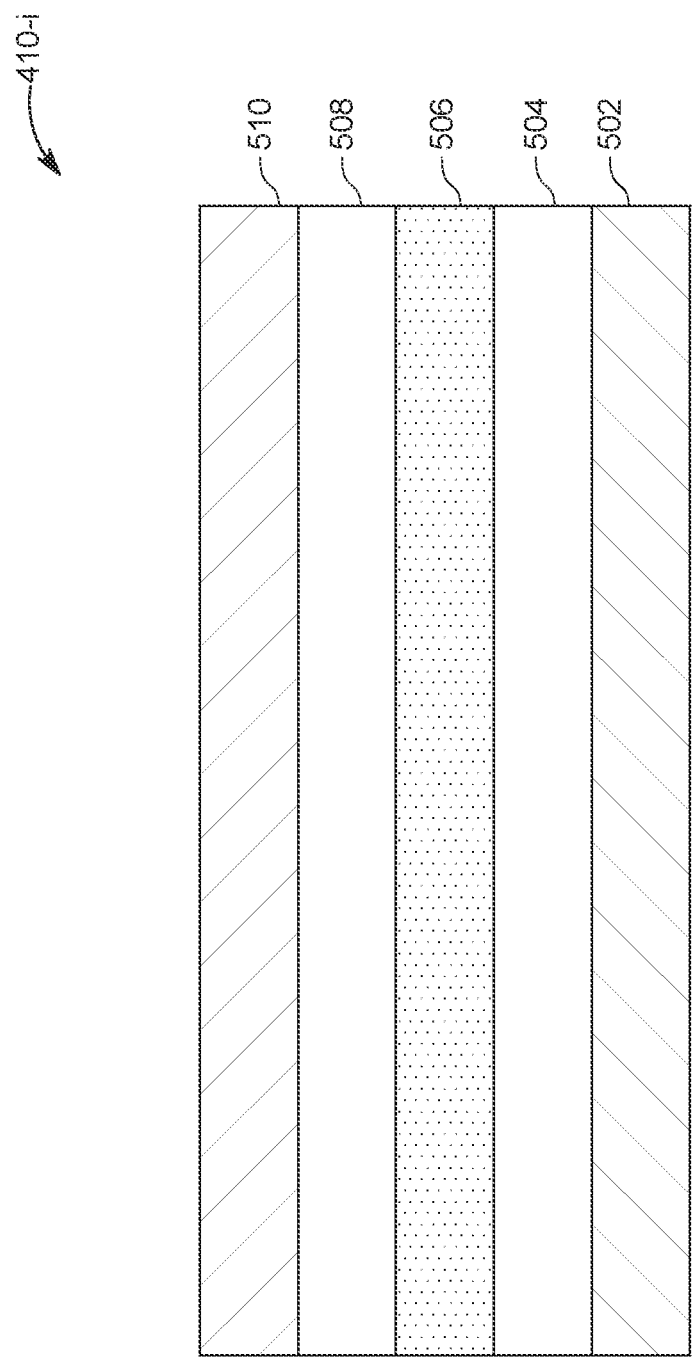
FIG. 5 illustrates an internal structure of a PV module.

A cross-section of the PV fold 410-*i* is shown in FIG. 5 and includes a first layer 502 that may be plastic film or glass forming a substrate and/or barrier, an encapsulating second layer 504 formed over the first layer 502, a third layer 506 that includes the actual PV cell 412-*i*, a fourth encapsulant layer 508 formed over the cell layer 506, and a top fifth layer 510, that may be made of glass, rigid plastic, flexible plastic film or other similar materials. Typical materials used for the second and fourth encapsulation layers are ethylene-vinyl acetate (EVA), polyvinyl butyral (PVB), thermoplastic polyurethane (TPU) or similar materials. Other materials for the encapsulant such as plastics made of ethylene tetrafluoroethylene (ETFE), polyvinyl fluoride (PVF), may also be used. The use of plastics rather than glass throughout the layer stack but in particular in the case of the layers 502 and 510 allows to keep the individual strings at a low weight.

The PV cells are connected together into strings using interconnection methods as used for conventional folds, like soldering or gluing ribbons and bus wires or directly interconnecting the cells using printable conductive inks. The shapes, sizes and the spacing of the cells (distance d in FIG. 4 between cells on the same string and distance D between cells from different folds) can be customized to control the transparency of the PV system. The term "transparency" in this application is used to describe the surface area of a PV fold that is transparent to sun light or any other type of artificial illumination. This means, that for the embodiment shown in FIG. 4, for the PV fold 410-2, region A (the area of the fold that is not occupied by PV cells 412-*i*) is transparent while the regions occupied by the PV cells 412-*i*, the end pad 416B, and the regions occupied by the interconnecting links 414-*i* are not transparent to light (unless the cells are so thin that they become transparent or other semitransparent solar cell technologies are used). In fact, the regions occupied by the PV cells, the interconnecting links, and the end pad are responsible for generating a shade behind the PV fold. By controlling the distances d, D and also the amount of folding of the PV folds 410-*i*, the transparency area and the shade area associated with the system 400 can be controlled. Thus, in this way, it is possible to control the amount of light that enters into the enclosure to which the PV system is attached (or simply to control the amount of light on the side of the PV system opposed to the incoming light).

Figure 6B:
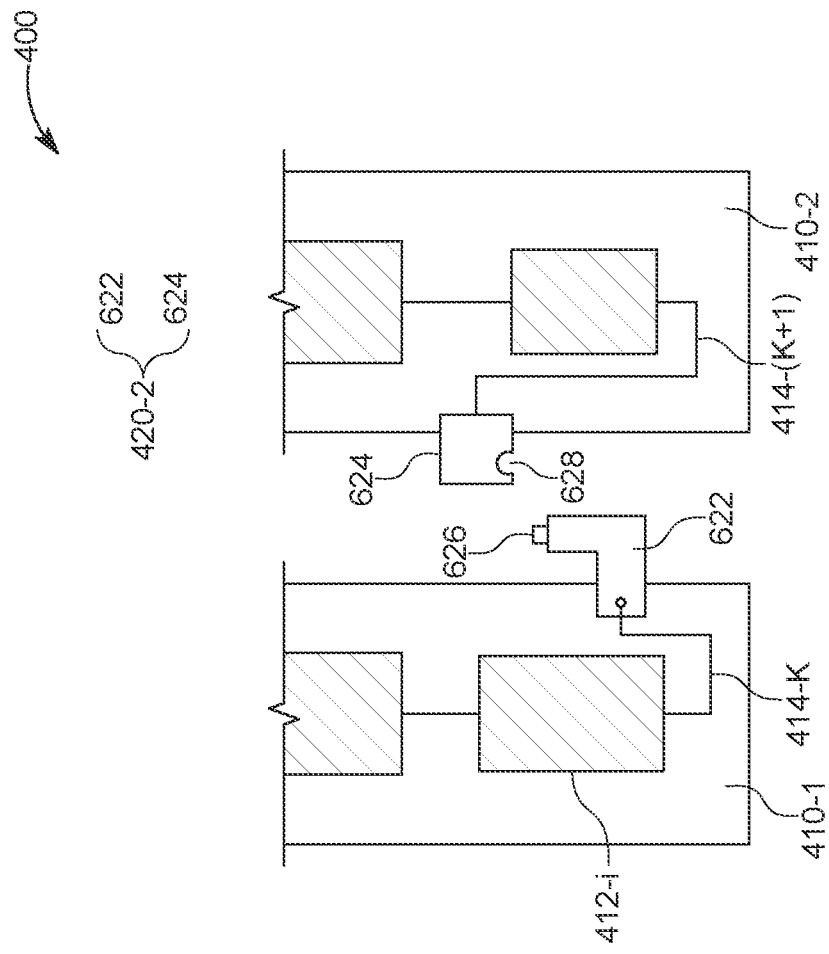
FIGS. 6A and 6B illustrate a foldable, retractable and modular PV system with an electrical interconnection mechanism.
Figure 6A:
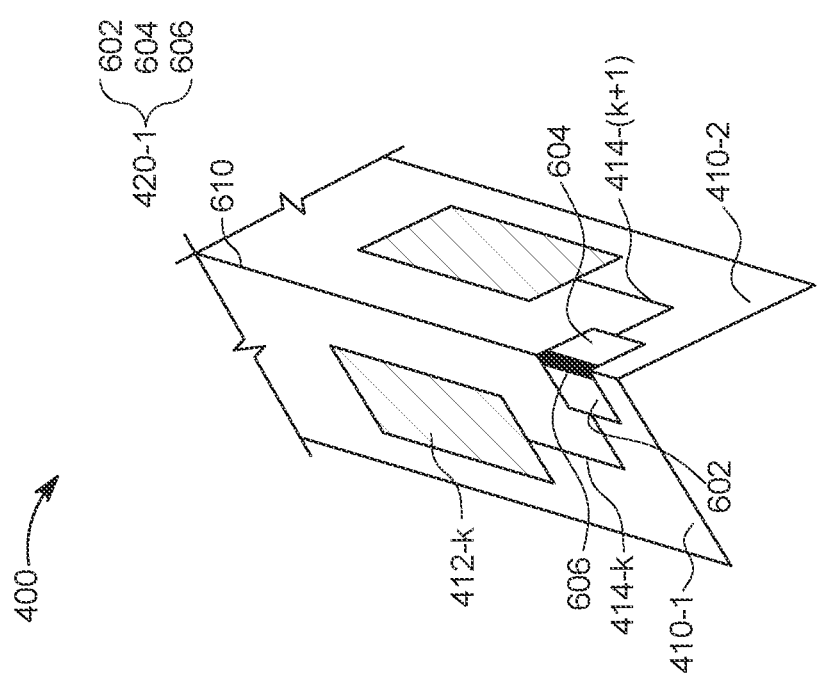

The connecting mechanism 420-1 is illustrated in FIG. 6A as a one-unit device. The connecting mechanism 420-1 has two sides 602 and 604 attached to each other with a rod 606 or similar mechanism. Each side is attached to a corresponding PV fold by glue, screws or equivalent mechanism. The two sides are made of a material that conducts electricity so that the two interconnecting links 414-*k* and 414-(*k*+1) can be soldered to the two sides 602 and 604. FIG. 6A shows the two PV folds 410-1 and 410-2 partially folded along a folding line 610.

In a different embodiment illustrated in FIG. 6B, the connecting mechanism 420-2 is a two unit device that has a first part 622 attached to a first fold 410-1 and a second part 624 attached to a second fold 410-2. The first part 622 (or the second part) has a male part 626 and the second part 624 (or the first part) has a female part 628. The male and female parts connect to each other, for example, they snap to each other or click on each other. In one application, the male and female parts are made of a flexible material, so that they are bendable. The first and second parts 622 and 624 are glued, screwed or molded to their corresponding PV folds so that when the system 400 is assembled, the first part 622 simply snaps into the second part 624. The first and second parts 622 and 624 may be electrically connected to the interconnecting links 414-*k* and 414-(*k*+1) and they may be made of a conductive material for ensuring electrical connection between the interconnecting links.

Figure 6C:
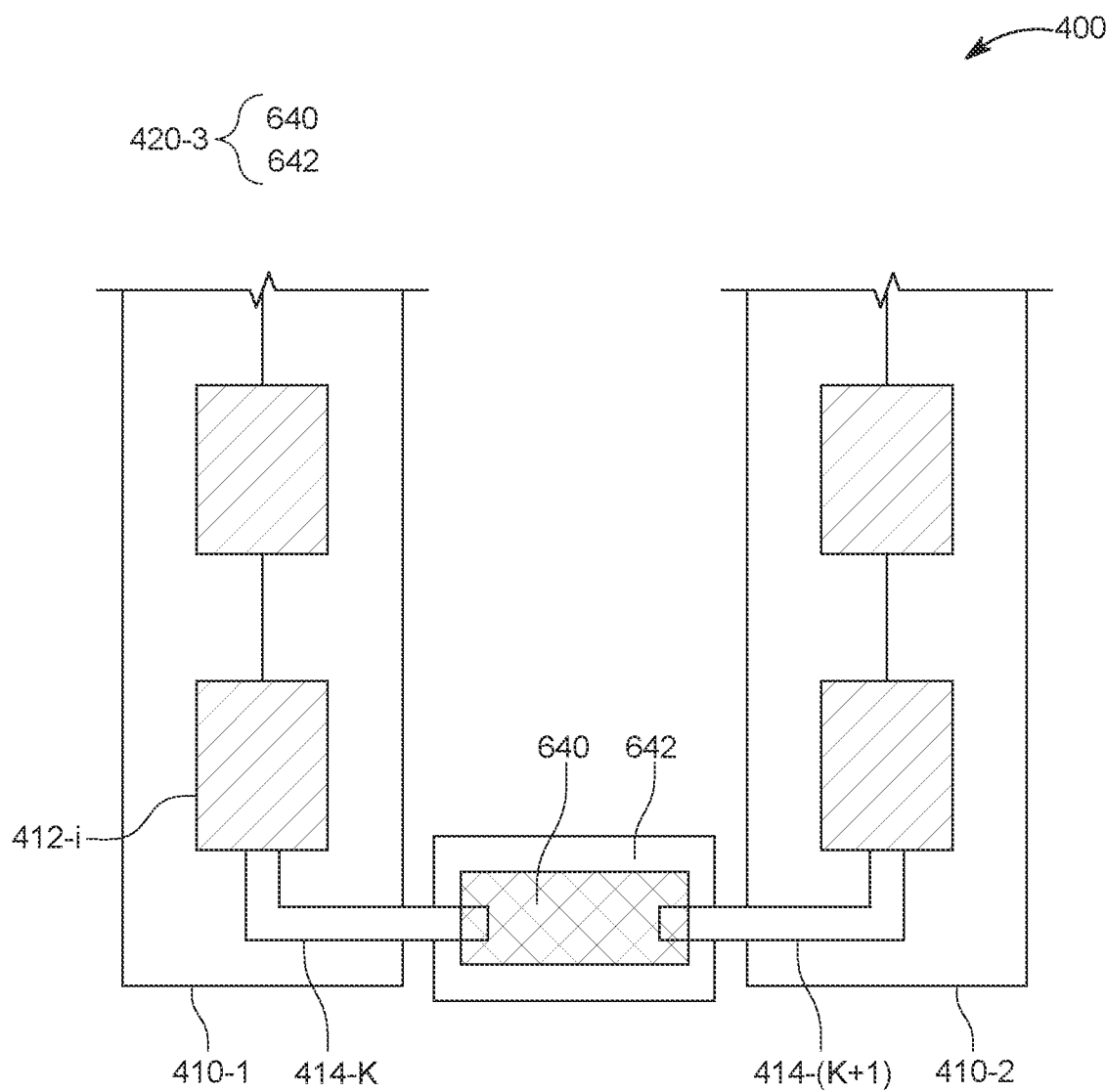
FIGS. 6C to 6E illustrate a flexible connecting mechanism that connects PV folds.

In yet another embodiment, as illustrated in FIG. 6C, the interconnecting links 414-*k* and 414-(*k*+1) are configured to extend past their folds 410-1 and 410-2, as shown in the figure. Then, these interconnecting links, which may be conductive tabs, are electrically and mechanically connected to each other with a flexible connecting mechanism 420-3 that includes a tab connector 640 that may be covered with a laminated film 642 (for example, epoxy resin), for environmental protection. The tab connector 640 may include a thin layer of metal for conducting electricity and also so that the entire flexible connecting mechanism 420-3 is flexible, and can bend easily. In one application, the flexible connecting mechanism 420-3 ensures only electrical connection between the two PV folds and a mechanical connection for folding the PV folds is still necessary. However, in another application, the structure of the flexible connecting mechanism 420-3 may be strong enough to also function as a mechanical connection between the two PV folds.

Figure 6D:
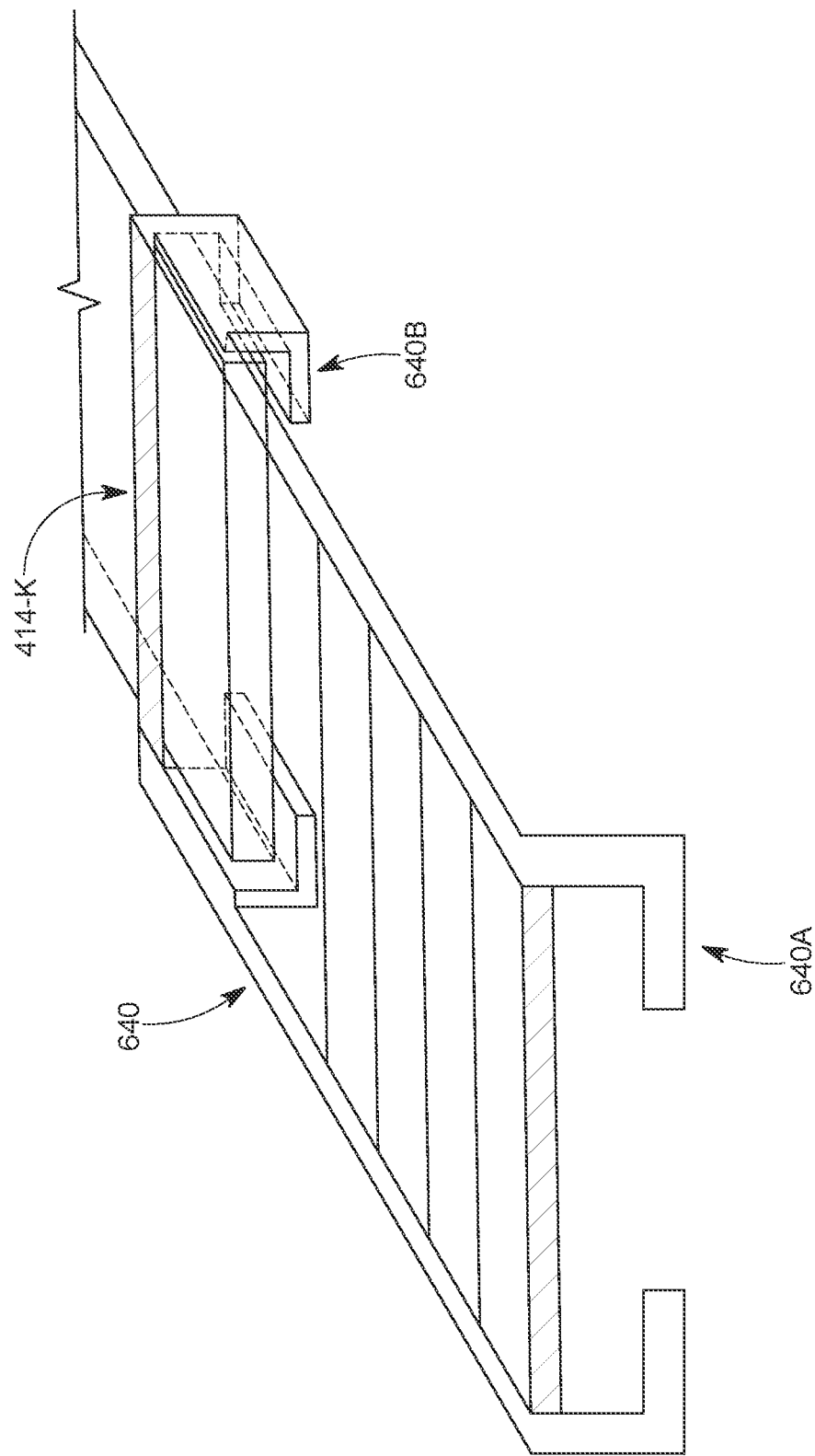

In one application, as shown in FIG. 6D, the tab connector 640 may be formed to have distal, metallic, deformable extensions 640A and 640B. These deformable extensions are configured to receive a corresponding conductive tab 414-*k* and then, with a crimping mechanism, a mechanical and electrical connection between the tab connector 640 and the conductive tab 414-*k* for each fold can be achieved.

Figure 6E:
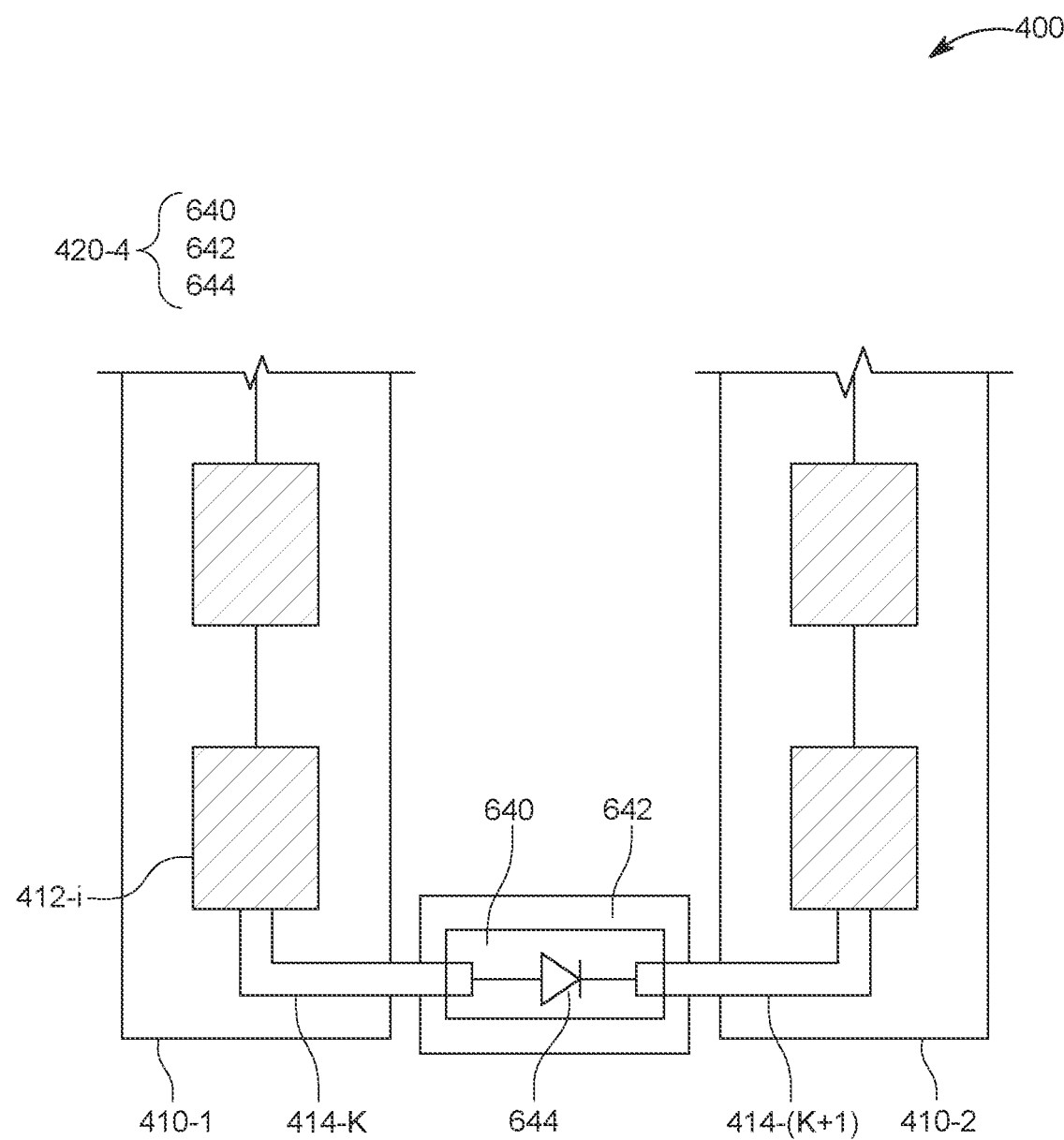

In one variation of this embodiment, as illustrated in FIG. 6E, a by-pass connecting mechanism 420-4 has the tab connector 640 including a diode 644 so that an electrical current can pass only along one direction, for example, from fold 410-1 to fold 410-2 and not the other way around. This by-pass diode 644 is helpful when one or more PV cells are faulty and an entire fold needs to be bypassed.

Figure 6F:
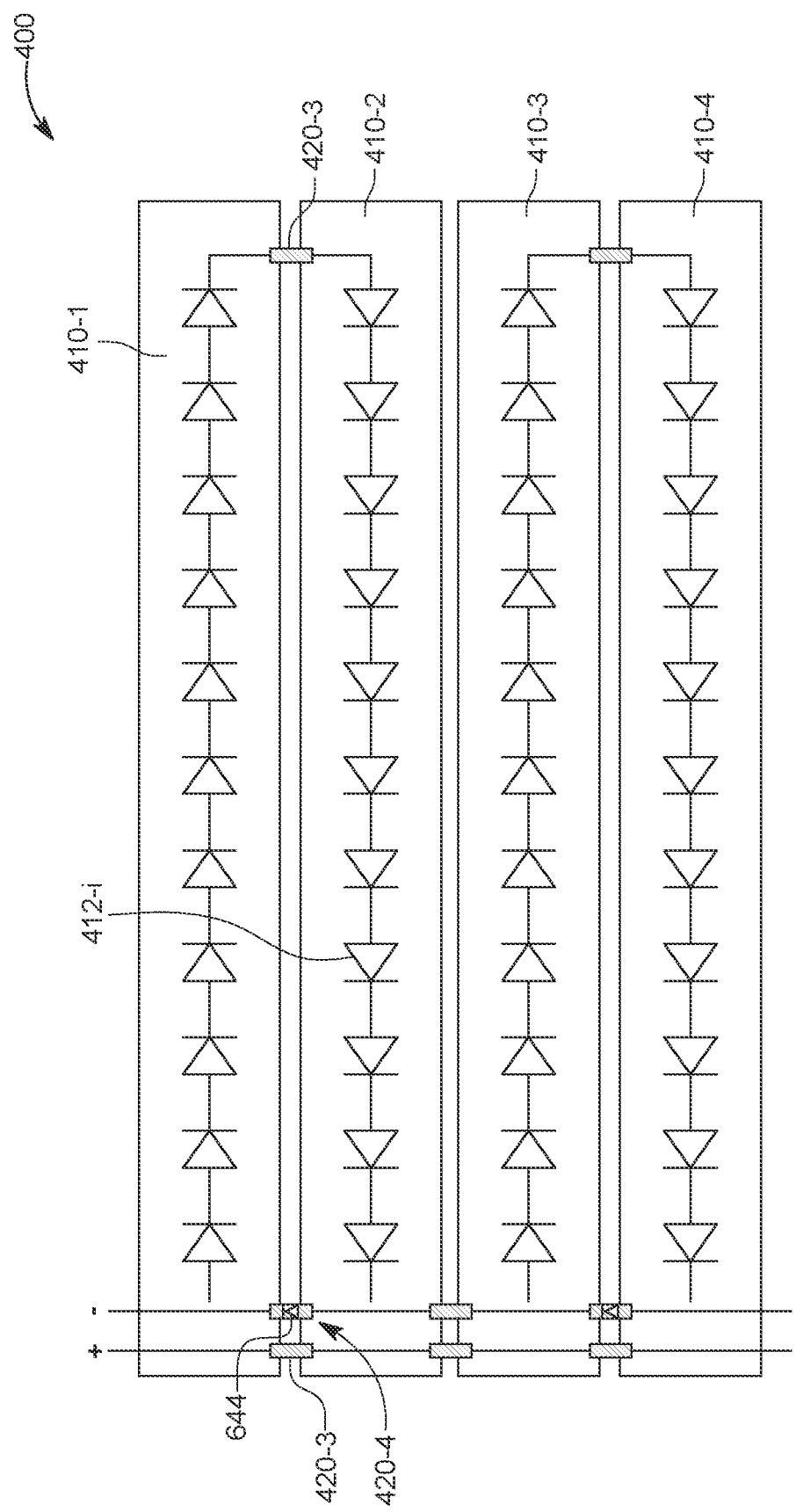
FIG. 6F illustrates plural PV folds connected to each other with a flexible connection that includes a by-pass diode.

For example, as illustrated in FIG. 6F, one or more PV folds are connected to adjacent PV folds with a combination of connecting mechanisms 420-3 and 420-4. The PV fold 410-1 in this figure is connected with a flexible connecting mechanism 420-3 to an adjacent PV fold 410-2, but also with a by-pass connecting mechanism 420-4. In this way, if a PV cell 412-*i* fails (note that each PV cell is represented by a diode in the figure as each PV cell acts as a diode, i.e., allows current flow in a single direction), the entire PV fold 410-2 may be by-passed due to the by-pass connecting mechanism 420-4, and thus, the current produced by the PV fold 410-3 arrives directly to the PV fold 410-1, by-passing the faulty PV fold 410-2, due to the by-pass diode 644 that is present in the by-pass connecting mechanism 420-4. Note that this configuration is implemented by having three connecting mechanisms (two flexible connecting mechanisms 420-3 and one by-pass connecting mechanism 420-4) between each two adjacent PV folds, as shown in FIG. 6F. Therefore, with this arrangement, no matter how many PV cells fail and no matter where they are located in the PV system 400, the current generated by the other PV folds is still being routed to the output of the system. In addition, with this configuration, the connections between the PV folds are bendable and flexible, do not involve moving mechanical parts, and thus, they are cheap to be implemented and not prone to mechanical failures during the retracting process.

Still with regard to the PV system 400 shown in FIG. 4, full cells, half cells and smaller fractions of full cells can be used for each string. Note that it is customary in the PV cell industry to manufacture the PV cells to have a given size. Thus, a full PV cell means the size that is customary used for fabricating these cells. By using full cells, half cells and smaller fractions of full cells in this embodiment, it is possible to control the geometrical fill factor (i.e., the transparency of the fold and also the shadow generated by each fold), and thus the transparency of the assembled system. The electrical interconnections combined with the size of the solar cells can be designed to control the voltage and current output (high voltage, small current; high current, small voltage and intermediate current/voltage).

Figure 7:
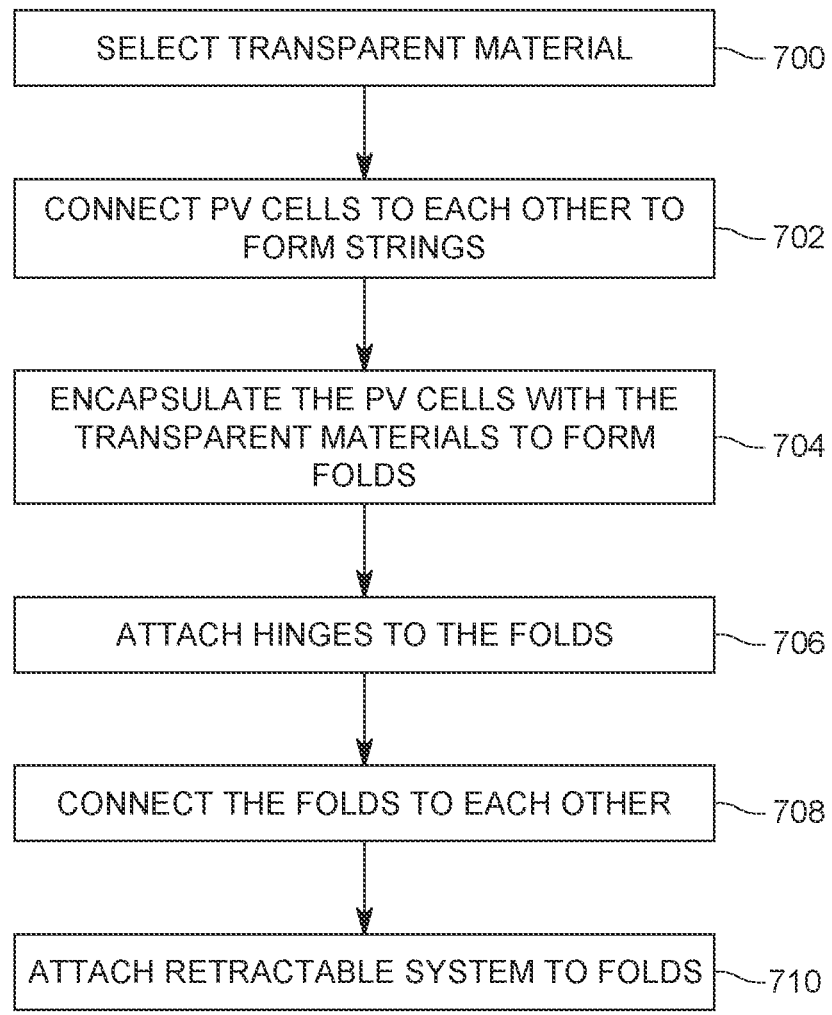
FIG. 7 is a flowchart of a method for making a PV system.

The strings of cells 412-$i$ that are part of each fold 410-$i$ are made into PV laminates for protecting the cells from the environment and also for controlling the transparency of the fold and allowing the PV system to be mechanically foldable and retractable, to obtain a dynamic solar screen system that flexibly opens and closes for controlling a shade behind the screen and/or air penetration. A method for making a PV fold 410-$i$ is now discussed with regard to FIG. 7. In one application, the string of cells is laminated using a transparent material and any of the manufacturing techniques like vacuum lamination, roll lamination, autoclave, etc. To make the laminates transparent to light, the materials selected for the encapsulant and for the front and rear protection need to be transparent. Thus, in step 700, one or more transparent materials are selected and in step 702, plural PV cells are electrically connected to each other. Then, in step 704, the electrically connected PV cells, which are selected to fit a single PV fold, are run between top and bottom transparent materials, as illustrated in FIG. 9A, to form the PV fold 410-$i$. Each panel of the system 400 may be formed in this way. Then, in step 706, one or more hinges (as illustrated in FIGS. 6A and 6B) are added to the panels and in step 708 the panels are attached to each other to form the PV system 400. Thus, this system is modular. In step 710, the folds are made retractable by attaching the actuation mechanism 430 and the folding mechanism 440. Details about the actuation mechanism 430 and the folding mechanism 440 are discussed later.

Figure 1:
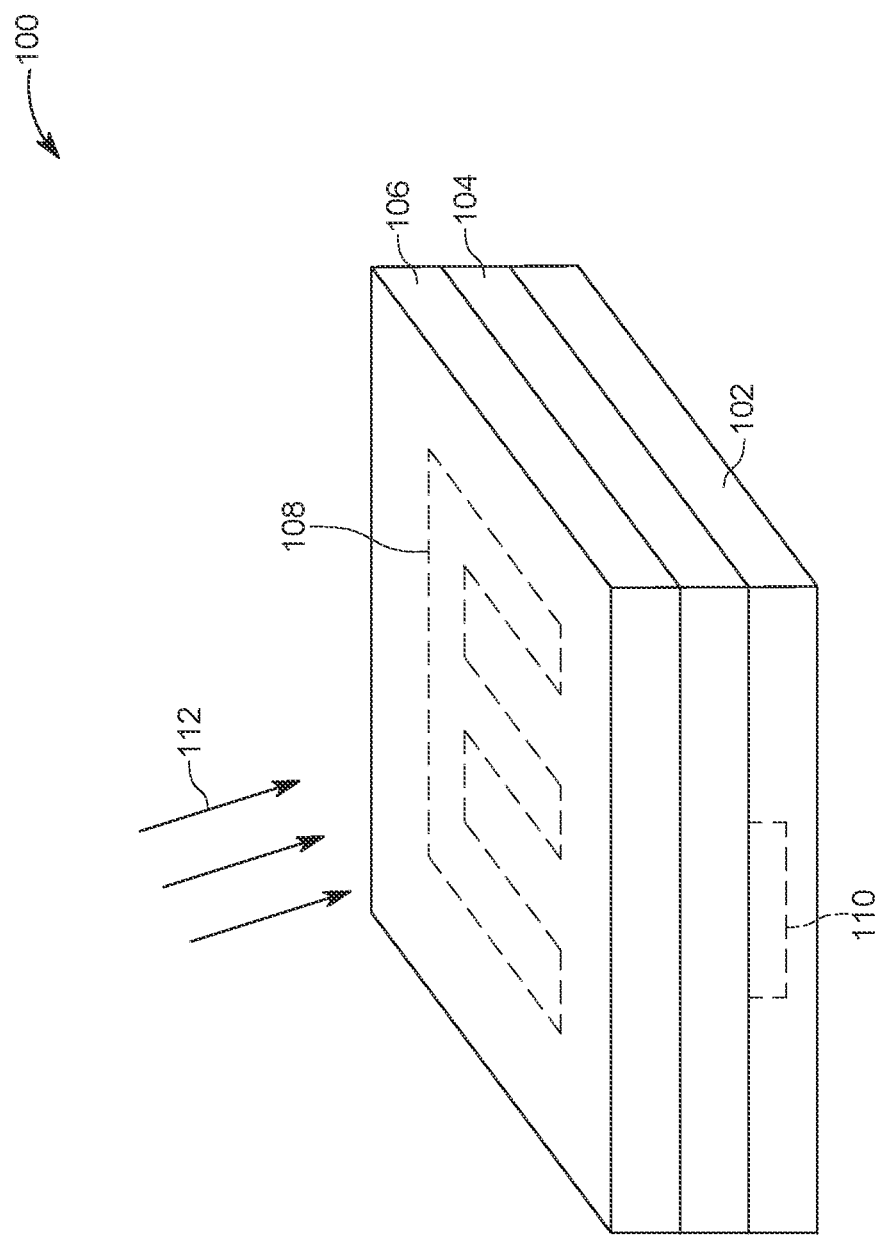
FIG. 1 illustrates a traditional solar cell.
Figure 2:
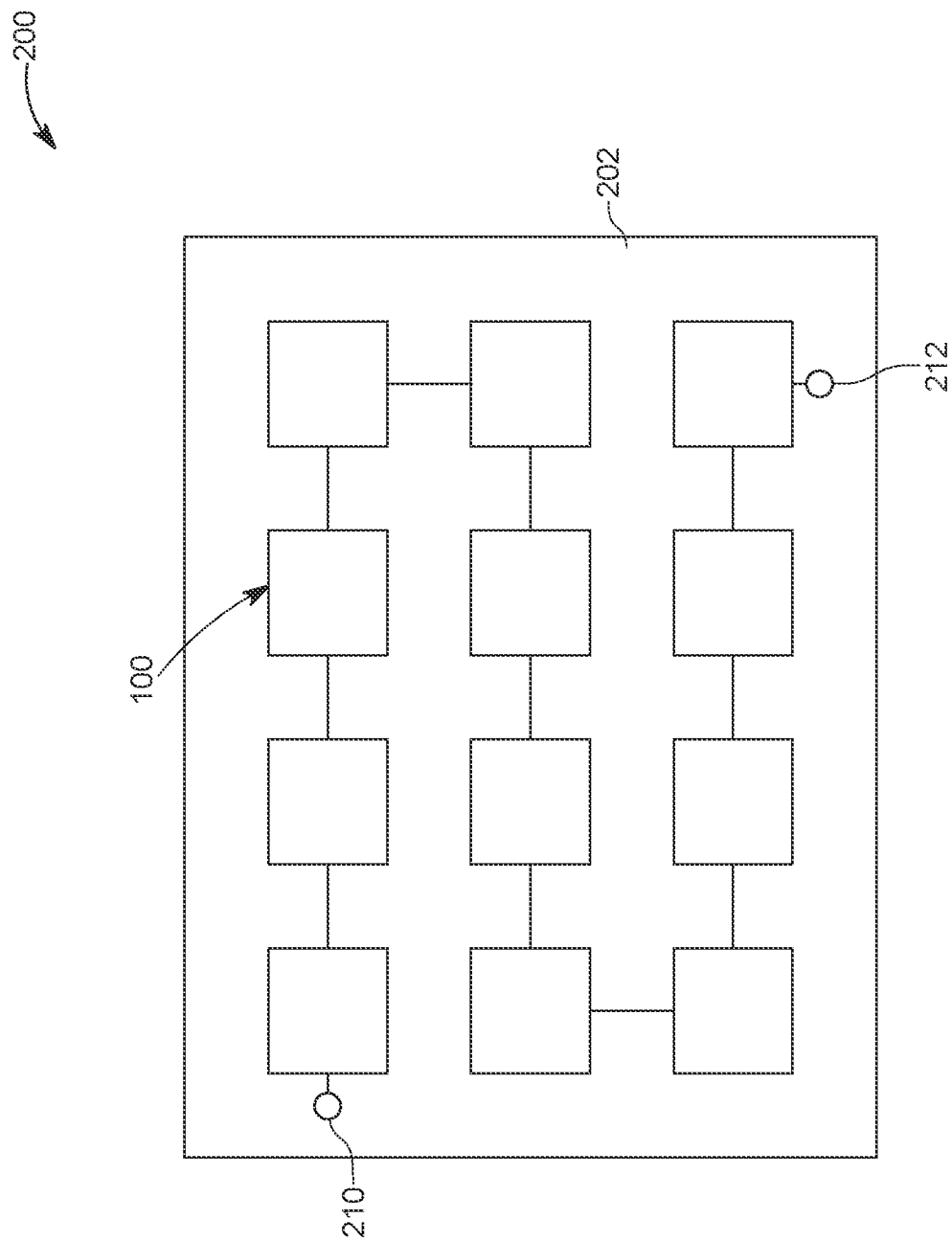
FIG. 2 illustrates a solar cell module that includes plural solar cells.
Figure 3:
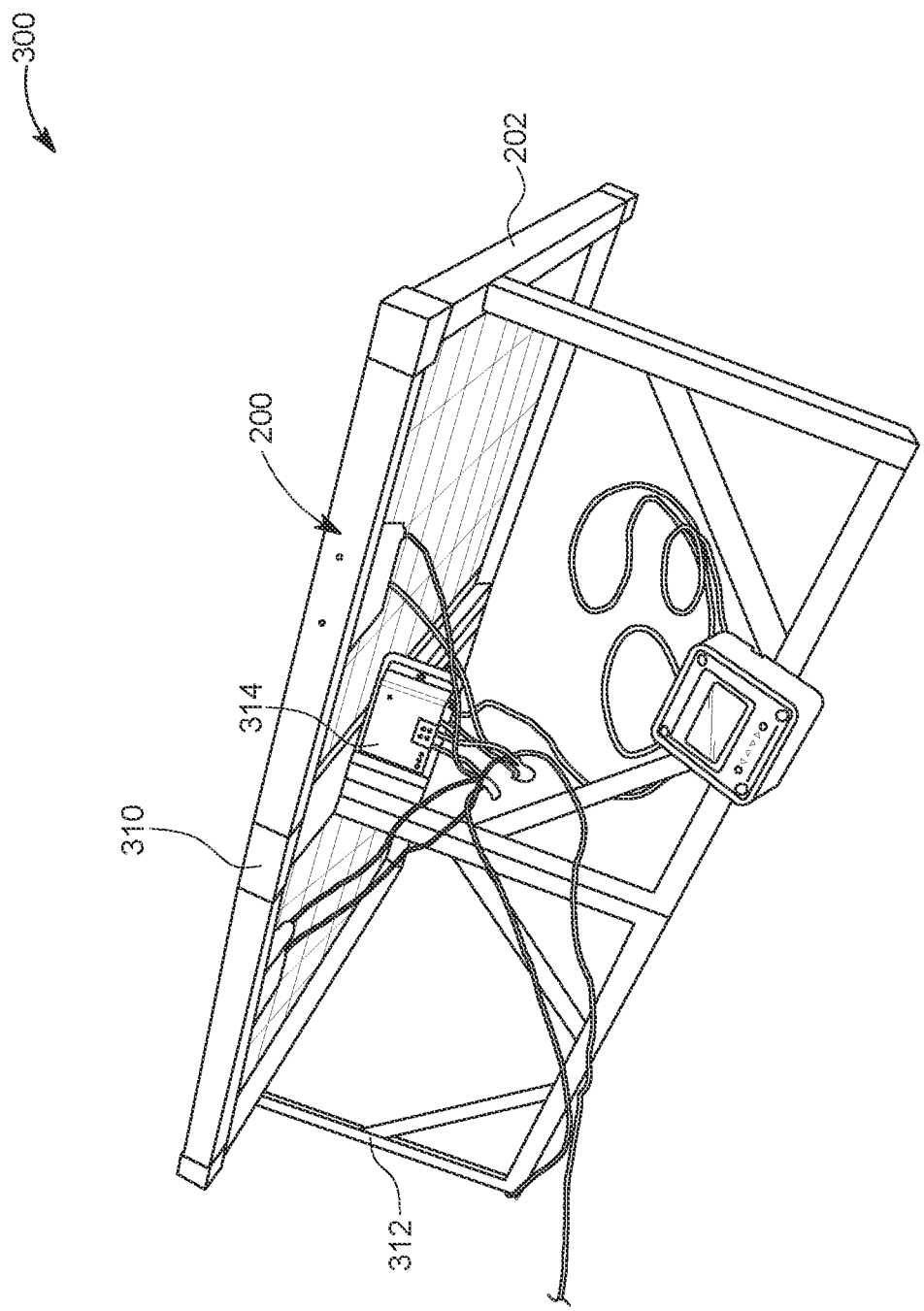
FIG. 3 illustrates a foldable solar system.

As opposed to existing foldable solar systems, for example, the one discussed above with regard to FIG. 3, the PV system 400 is modular and the folds are dynamically adjustable. The term "dynamically adjustable" is used herein to mean that the folds of a system or module can be opened and closed along the folds, in the direction of the axis perpendicular to the fold. Existing foldable solar systems are not designed to be dynamically adjustable, do not allow to control transparency and shading over an area associated with the PV system, and are not modular. In this regard, the term "dynamically adjustable" in this patent means that the system can be opened and closed in a controlled way, either manually or automatically. The folds may be attached to a mechanical support system and will be folding along the joints between the folds as the system opens and closes.

The term "modular" in this context means that these folds can be combined into virtually any system length. The folds themselves can have different widths and lengths and geometrical fill factor (density of the solar cells) allowing a free shape for the final PV system.

In the embodiment illustrated in FIG. 4, the folds of the PV system 400 are interconnected both mechanically and electrically, using a connecting mechanism 420-$i$, alternately folding the folds in opposite directions starting from a first fold. In this modular system, the hinges will allow two adjacent folds to fold open and close and having the hinges alternately opening and closing in opposite directions, the whole system will collapse like a concertina. The unfolded length of the foldable system can simply be varied by connecting the required number of folds together while the total area covered by the folded system remains minimal, i.e., approximately the width of the fold times the number of folds (number of lamellae divided by two) times the length of the PV fold. These systems can be installed and retracted horizontally or vertically using mechanical guides (rails) and the opening and closing can be automated by using any method to hold the first fold in place and control the position of the final fold. Such methods can include the use of linear motors, or mechanical systems using pull cords or similar, as discussed later.

The electro-mechanical interconnects 420-$i$ are an integer part of the retractable solar folds. They mechanically support and electrically interconnect the folds (lamellae). The interconnects are secured at the extremity of the fold using either glue, tape, bolts/nuts, pins or other locking mechanisms. The interconnect can consist of one unit with two terminations ("fold hinge" as illustrated in FIG. 6A), in which one termination connects mechanically to one fold and the other termination connects to the next fold to form adjacent folds, or it can consist of two matching parts (as illustrated in FIG. 6B) with a simple quick connect, in which one part of the interconnect is attached to one fold and the other part to the other fold. An interconnecting principle (e.g., clip, clamp, magnet) then allows to connect one fold with the adjacent fold thereby forming a folding/bending edge. In both cases, a folding freedom from 0 to 180 degrees is ensured, providing the necessary mechanical stability during the retraction mode. The interconnect may consist of a conductive metal, allowing electrical connection between cells of one fold and the cells of an adjacent fold to form a photovoltaic system. In this case, e.g., solar ribbon, conductive wire or conductive ink emerging from the cells of one fold could be electrically connected to one part of the conductive interconnect first, while on the opposite side of the interconnect it is electrically connected to the adjacent fold also via solar ribbon, conductive wire or conductive ink. The interconnecting principle then enables electrical connection between the folds. Alternatively, the interconnect could consist of an insulator (e.g., insulating plastic) with well-defined electrically conductive tracks on it. Similarly, the cells of the fold are then connected to the conductive tracks using conductive ribbon, wire, ink or something similar. The conductive tracks would be afterwards electrically isolated using, for example, an insulating adhesive.

Figure 8:
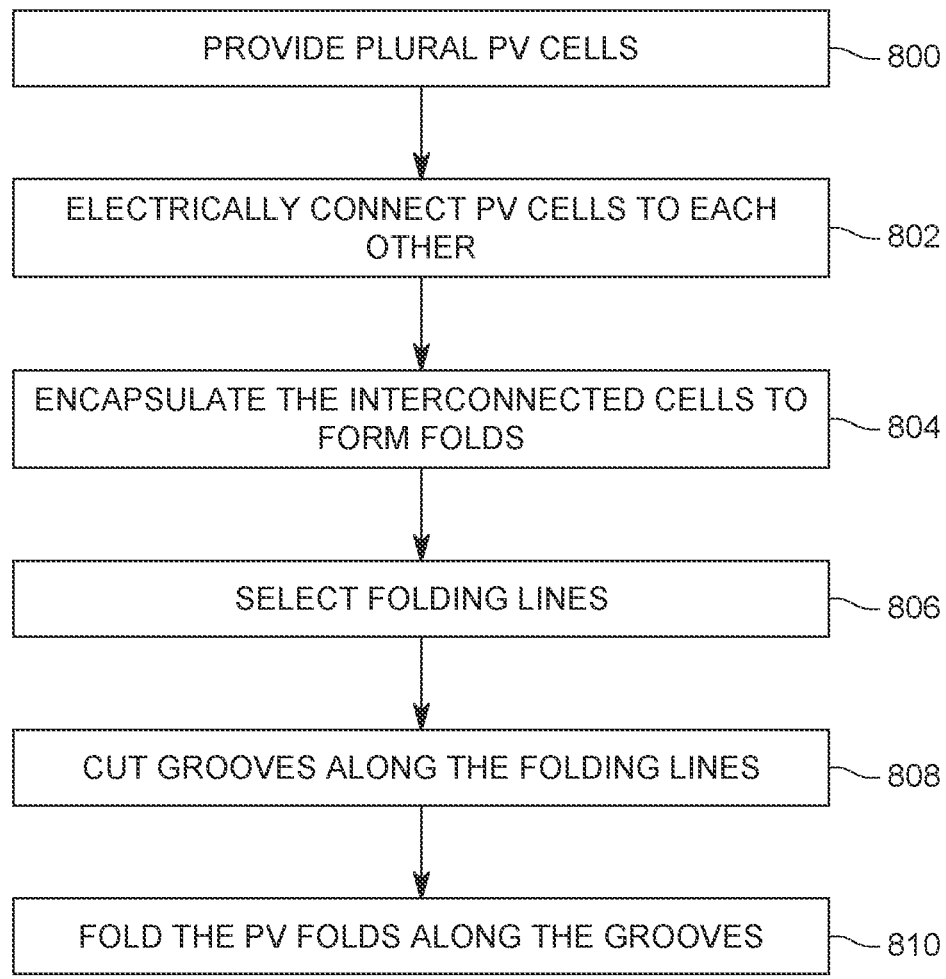
FIG. 8 is a flowchart of another method for making a PV system.

In a different embodiment, the PV folds 410-$i$ are electrically connected together and joined on a supporting film (for example, a plastic transparent material) as now discussed with regard to FIG. 8. Using a second material to create a film on the opposite side of the folds and using a manufacturing technique like roll lamination, a fully functional photovoltaic system is formed. As the individual folds are already protected from the environment, the material used for the secondary interconnecting lamination will not have the stringent requirements for photovoltaic folds and it is expected to be much cheaper. The interconnecting plastic films are then either molded or cut to increase the inter-laminate flexibility and create a concertina-type shape or even allow being rolled.

Figure 9B:
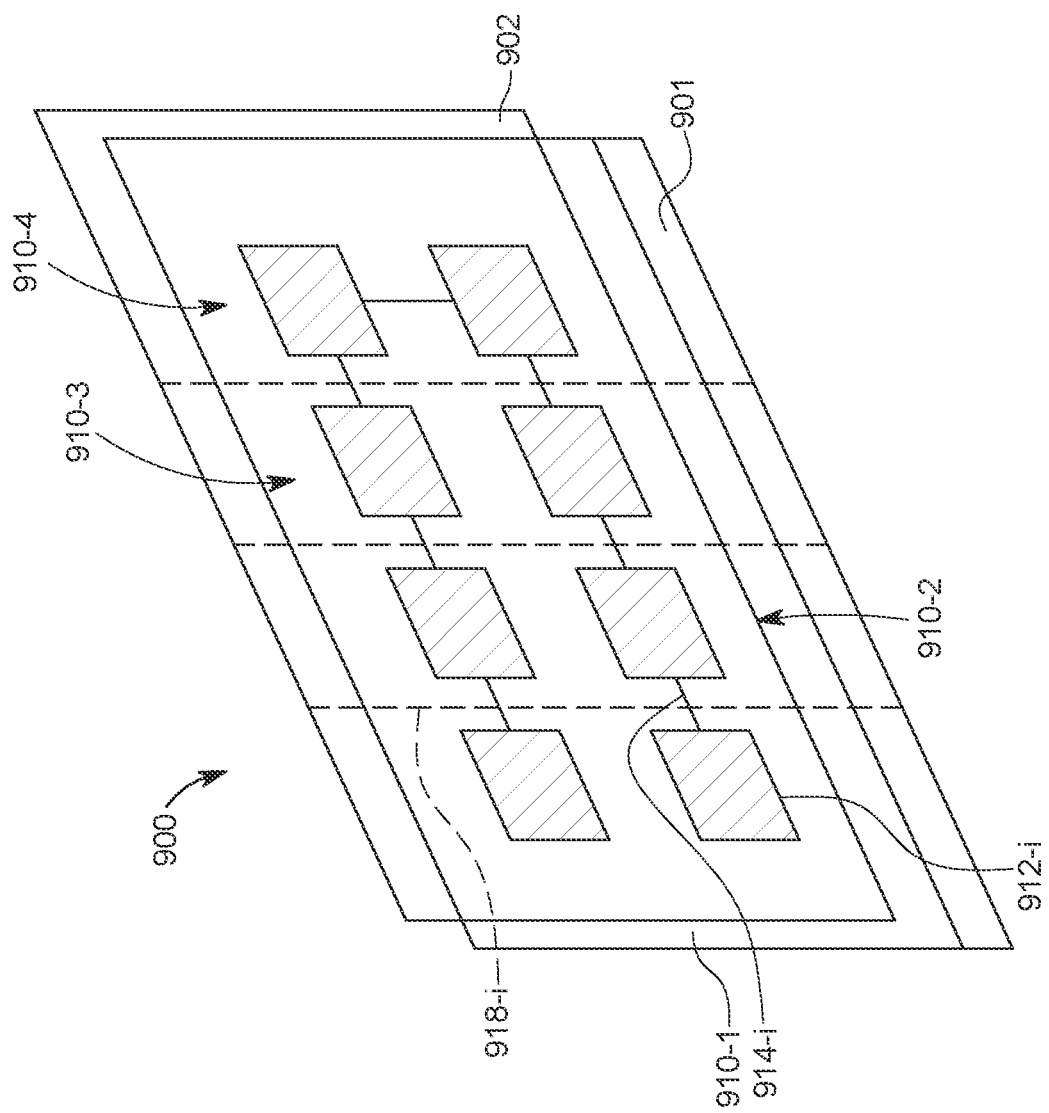

More specifically, in step 800 plural PV cells 412-$i$ are provided, in step 802, the PV cells are electrically connected to each other for forming the chain of cells necessary for a single fold. Then, in step 804, the plural cells are encapsulated between the supporting material 901 and the top material 902, as illustrated in FIG. 9A. For example, if a rolling method is used to encapsulate the PV folds, two roles 910 and 912 may be used to press against each other the supporting material 901 and the top material 902. A heater 914, which is shown being located inside one of the rollers, but it may be placed outside the rollers or inside both rollers, is used to partially melt the two materials 901 and 902 so that they are fused together after being pressed by the two rollers. Other methods such as vacuum lamination may be used to encapsulate the PV cells to form the PV system 900. An example of the final PV system 900 is shown in FIG. 9B, which illustrates the lack of hinges between the adjacent folds (or lamellae) 910-*i* (only four folds 910-1, 910-2, 910-3, and 910-4 are shown for simplicity). The interconnected solar cells of the PV system 900 form one module, whose length can be adjusted through the number of folds. The interconnection shown in 900 is only one possible way (here in series) of interconnecting the solar cells.

Figure 9C:
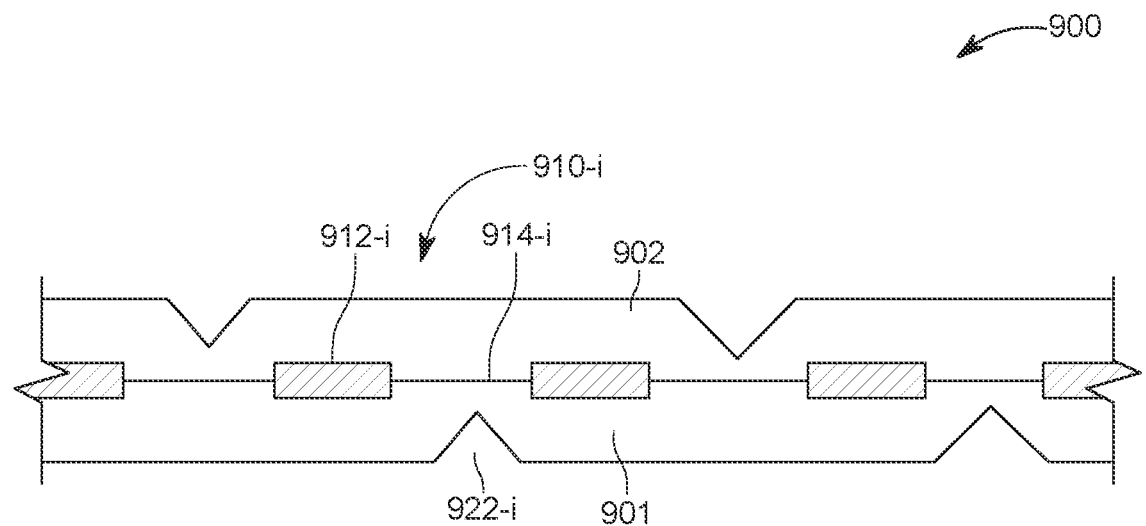
Figure 9D:
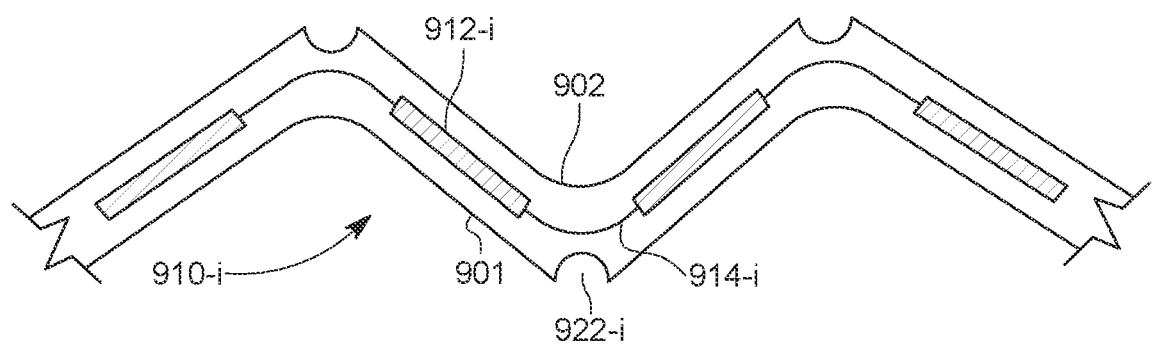

Returning to the method of FIG. 8, in step 806, folding lines 918-*i* (see FIG. 9B) are selected between adjacent folds or lamellae 910-*i* and in step 808 cuts (or grooves) 922-*i* are made at every second folding line on the supporting material 901 and the top material 902, as shown in FIG. 9C. The grooves 922-*i* help the panels to fold in step 810, when the dynamically adjustable screen system is actuated. Partially folded panels 910-*i* of the PV system 900 are shown in FIG. 9D with the grooves 922-*i* defining the folding lines and pointing to the outside of the folded system. Foldable PV systems with grooves, dents, indents or similar along all folds and on both sides are also possible.

Note that for the PV system 900, that has no hinges, the connection mechanism is in fact the top and supporting films 901 and 902, together with the groove formed between adjacent folds. Thus, the supporting and top films not only ensure that the PV cells have a substrate and are protected from the environment, but they also provide the necessary mechanical connections between the cells and the capability of folding and unfolding the resulting module. The supporting and top films are made of a transparent material for allowing the incident solar light to pass through them and emerge at the other end of the panel, for those areas that are not occupied by the PV cells. In this way, each fold is responsible for providing partial illumination behind the panel, and the PV system can control the amount of this illumination by the amount of folding of the folds. These features are not present in any of the existing PV systems.

Both PV systems 400 and 900 are essentially modular and allow motional flexibility and aesthetic freedom to photovoltaic systems of variable sizes. In addition to the transparency of individual folds, the shading under the folds can be controlled over a large area as now discussed. This is particularly relevant for greenhouse applications. For this purpose, retractable folds can be combined and installed parallel to each other, opposite to each other, at different orientations and at different heights to form dynamically adjustable screen PV systems of a large area. The foldable fold system can be programmed to open and close according to the natural lighting conditions and specific lighting requirements.

Figure 10:
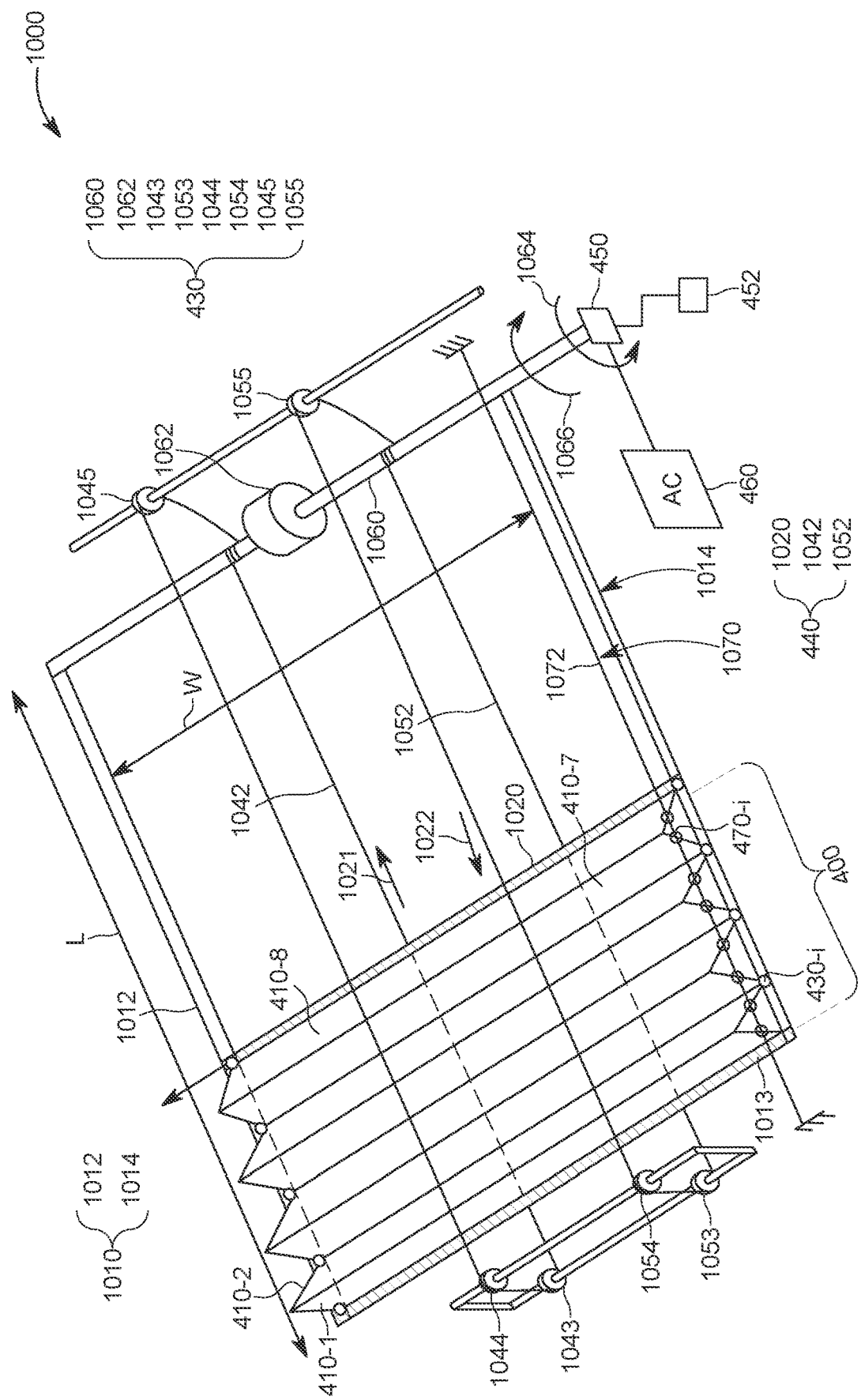
FIG. 10 is a top view of one possible implementation of the PV system.

More specifically, as illustrated in FIG. 10, a dynamically adjustable screen PV system 1000 that uses plural PV folds connected to each other either as shown in FIG. 4 or as shown in FIG. 9B, is attached to a retractable mechanism 1010 that includes a pair of rails 1012 and 1014. More rails may be used. A pulling bar 1020, which is part of the folding mechanism 440, is fixedly attached to one fold 410-8 of the PV system 400. For simplicity, the PV system 400 has only 8 folds or lamellae in this embodiment. However, any number of interconnected cells/folds may be used for the PV system 400. The pulling bar 1020 is connected to cables 1042 and 1052, which are also part of the folding mechanism 440. Cables 1042 and 1052 are continuous cables that extend under the PV system 400, between corresponding pulleys 1043 and 1053 and a rotating axle 1060. Rotating axle 1060 is connected to motor 1062, which is configured to rotate the axle 1060 in either direction 1064 (to open the PV system 400) or direction 1066 (to retract the PV system 400). The rotating axle 1060, motor 1062, and the pulleys are part of the actuation mechanism 430. Controller 450 is connected to the motor 1062 for controlling the rotation direction of the axle 1060. Additional pulleys 1044 and 1045 for the cable 1042 ensure that this cable can move in either way so that the pulling bar 1020 can move along direction 1021 to fold the PV system 400 or along direction 1022 to retract or fold the PV system 400. Similarly, additional pulleys 1054 and 1055 ensure that cable 1052 can move in either direction as dictated by motor 1062.

Returning to the PV system 400 in FIG. 10, it is noted that only the panel 410-1 is fixedly attached to a bar 1013, which is also fixedly attached to the rails 1012 and 1014. All other folds of the PV system 400 can move (rotate) relative to rails 1012 and 1014. Wheels 430-*i* or similar devices may be attached along every second folding line of the PV system 400 to further facilitate the folding and unfolding of the system. The wheels 430-*i* are configured to run along the rails 1012 and 1014. In one application, the wheels are replaced by corresponding tabs, which extend into the rails and are configured to slide along the rails.

To prevent the folds of the PV system to sag under their weight when they are fully opened or unfolded, it is possible to add a support system 1070 that includes at least one cable 1072, that is fixed at its ends. The cable 1072 extends through holes 470-*i* formed in each panel 410-*i*, so that each panel is supported by this cable. Although FIG. 10 shows only one cable 1072 and corresponding set of holes 470-*i*, it is envisioned that in some applications more than one cable may be used. The number of cables would be dictated by the width W of the PV system 400 and the also by its length L. Any width W and length L may be used. Note that the PV system 400 as illustrated in FIG. 10 may be installed on vertical, horizontal or inclined surfaces. These surfaces may be part of a house, industrial building, commercial building, like a hotel, a greenhouse, a parking lot, etc. The actuation mechanism 430 is controlled by the controller 450.

In one embodiment, one or more sensors 452 are connected, in a wired or wireless manner, to the controller 450. The sensor 452 may be a temperature, light, humidity or other type of sensor. For example, if the system 1000 is deployed under the roof of a greenhouse, the sensor 452 may be a light sensor. If the controller measures solar irradiation below a certain threshold, the controller instructs the actuation mechanism to retract (fold) the PV system 400 to allow more solar light to enter the greenhouse and irradiate the plants. When the controller detects that the solar irradiation measured by sensor 452 is above the certain threshold, the controller instructs the PV system to open (unfold) to generate shade for the plants inside the greenhouse, and thus to limit the amount of solar energy entering the greenhouse. In addition, if an air conditioner system 460 is present and connected to the greenhouse, the controller may be programmed to power the air conditioner with the energy generated by the PV system 400, and to further control the temperature inside the greenhouse. While the example here used a greenhouse, the system described above can be used for any type of building or enclosure. It is noted that the PV system 400 described herein is used not only to generate electrical energy from solar energy, but also to control an amount of solar energy that enters an enclosure on which the PV system 400 is located, i.e., to control the transparency of the PV system 400 and the shade made by the system inside the enclosure. This could be used to optimize the growth of plants in a greenhouse or similar, or to control shadowing.

Figure 11:
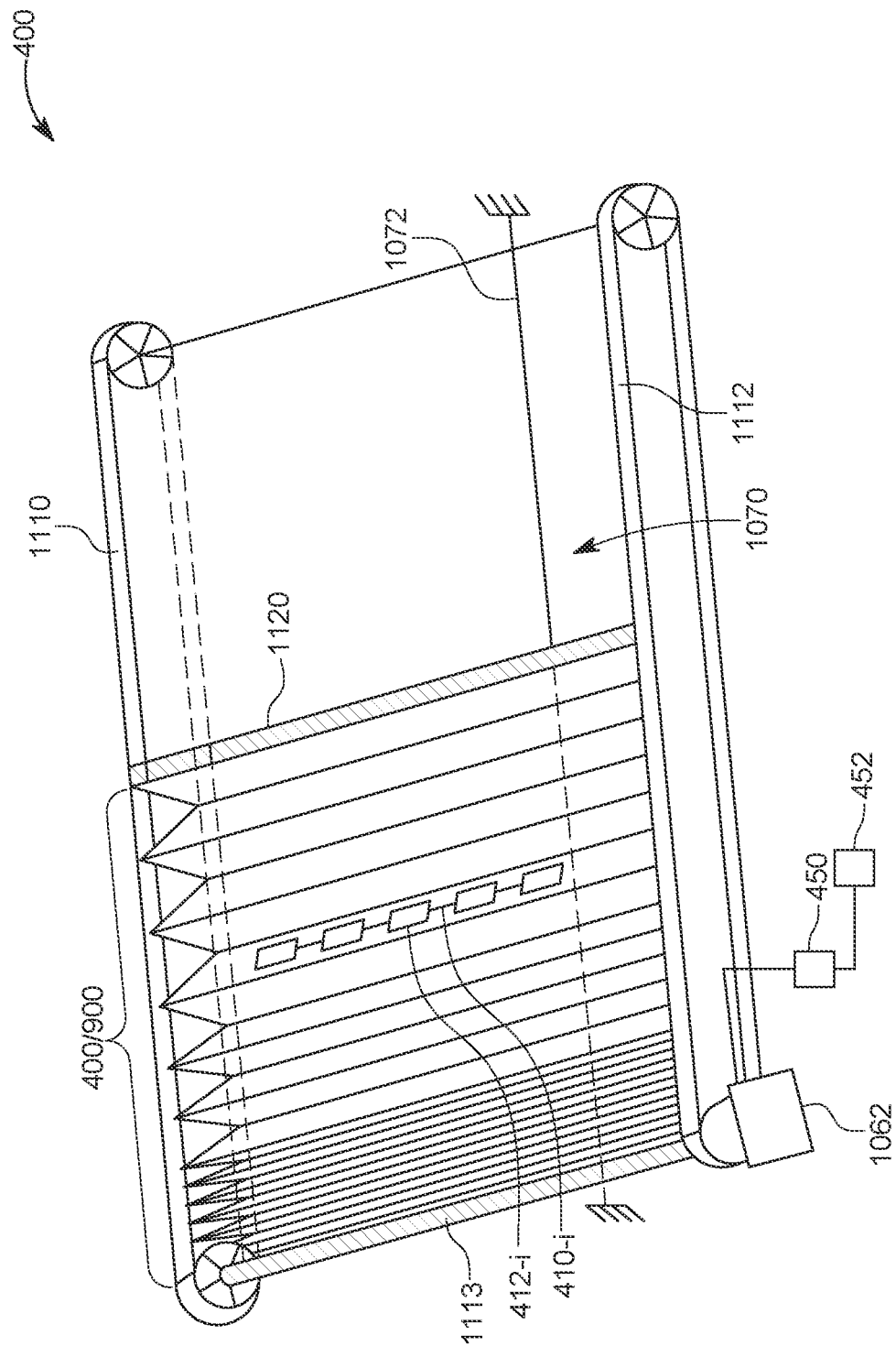
FIG. 11 is a top view of another possible implementation of the PV system.

The actuation mechanism 430 can also be implemented as a motor 1062 that actuates two belts 1110 and 1112 as illustrated in FIG. 11. The retractable system 1100 includes the dynamically adjustable screen PV system 400 or 900, which is attached with a first fold to a rod 1113, which is fixed, and with an end fold to a moving rod 1120. The moving rod 1120 is attached to the belts 1110 and 1112 so that the motor 1062 can open and retract the dynamically adjustable screen PV system 400 by moving the rod 1120 back and forth. The controller 450 and sensor 452 may be connected to the motor 1062 as in the embodiment of FIG. 10. Similar to the embodiment of FIG. 10, it is possible to have wheels or pads or similar devices for attaching the folds to the belts 1110 and 1112, so that they can be folded and unfolded. In addition, the support system 1070 (with cable 1072) of FIG. 10 may also be added to the retractable system 1100 to support the folds 410-*i*.

Figure 12A:
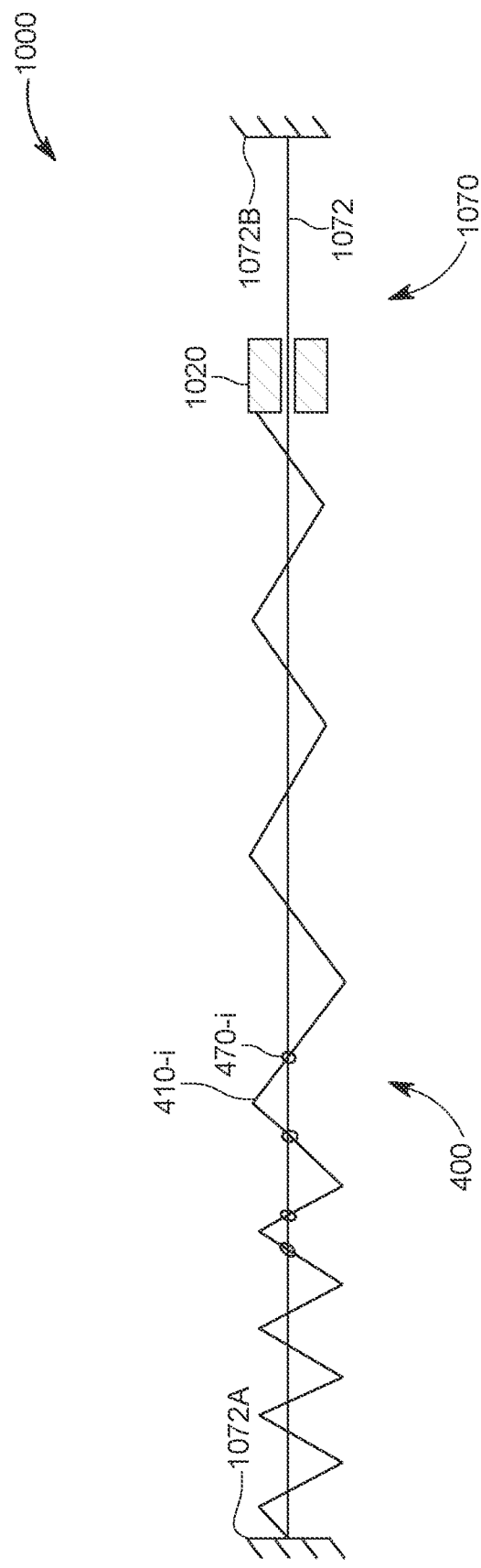
FIGS. 12A and 12B illustrate a cross-section view of the PV system and associated actuation and folding mechanisms.
Figure 12B:
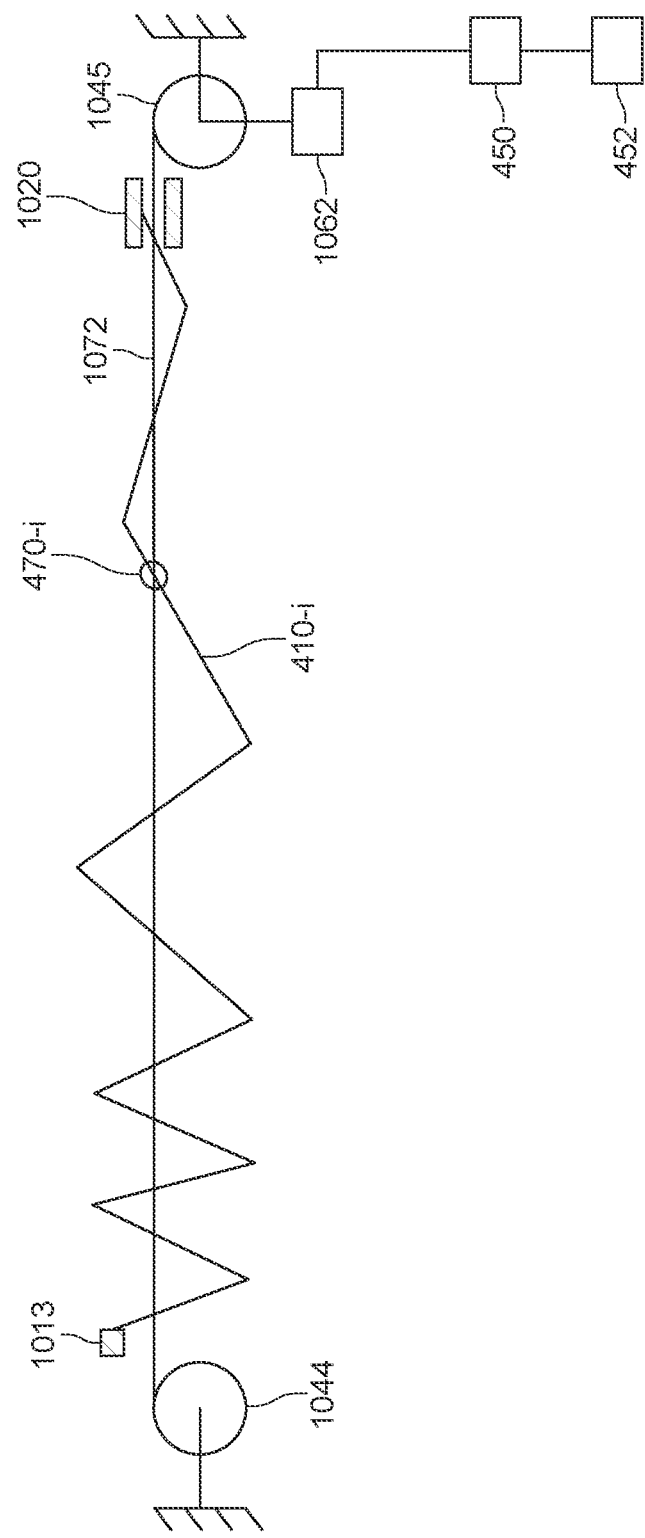

FIG. 12A shows a cross-section view of the retractable system 1000 in which only the dynamically adjustable PV system 400, the support system 1070, and the pulling bar 1020 are shown. The support cable 1072 passes through holes 470-*i* formed in each fold 410-*i* and its ends 1072A and 1072B are fixedly attached to either the actuation mechanism 430, the folding mechanism 440, or any other fixed element. In one embodiment, it is possible to use the support system 1070 to fold and unfold the PV system 400, instead of the folding mechanism 440, if the pulling bar 1020 is fixedly attached to the cable 1072 and the fixed ends 1072A and 1072B are in fact pulleys 1044 and 1045, one of which being connected to motor 1062, as illustrated in FIG. 12B.

Figure 13A:
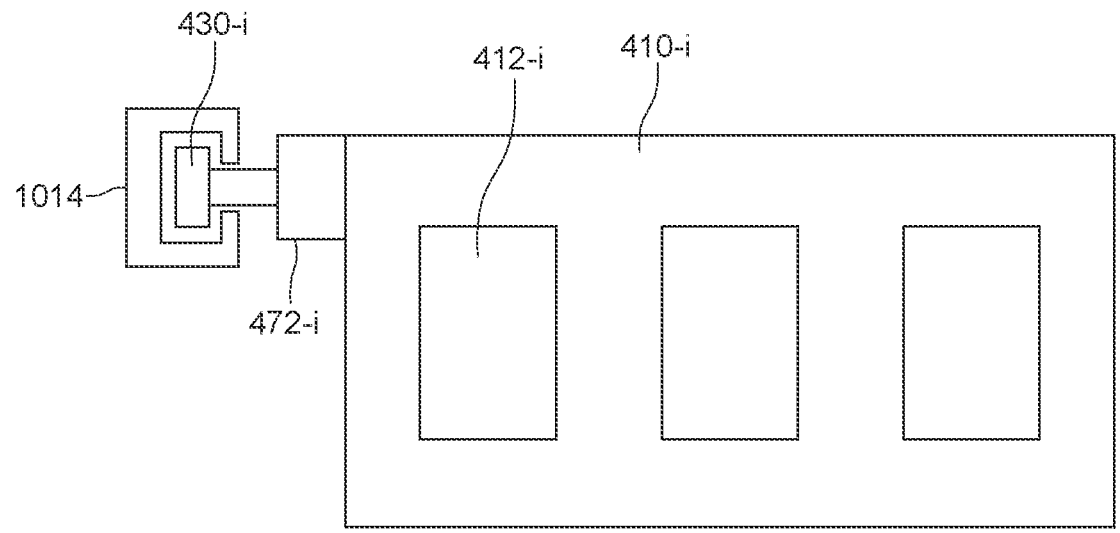
FIGS. 13A to 13D illustrate details of the folding mechanism associated with the PV system.
Figure 13B:
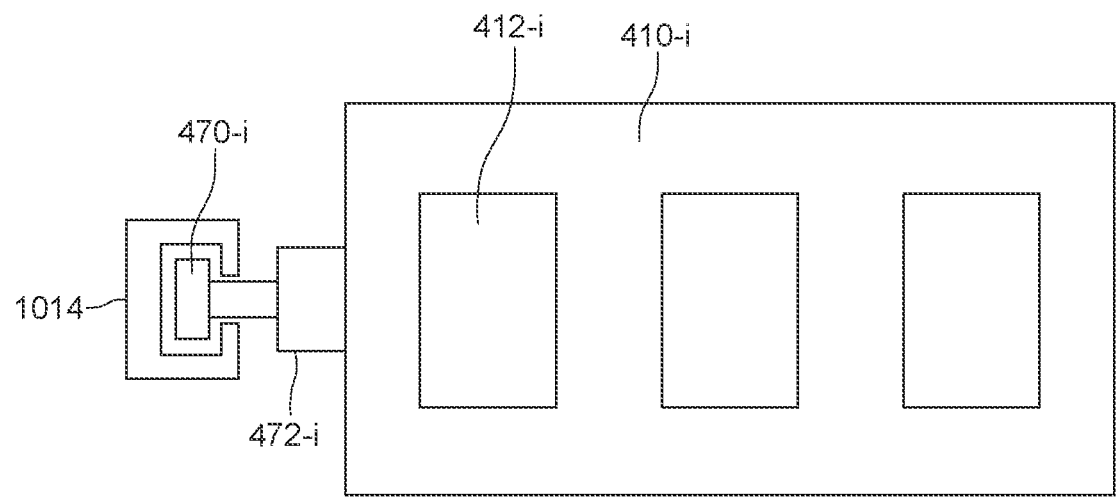
Figure 13C:
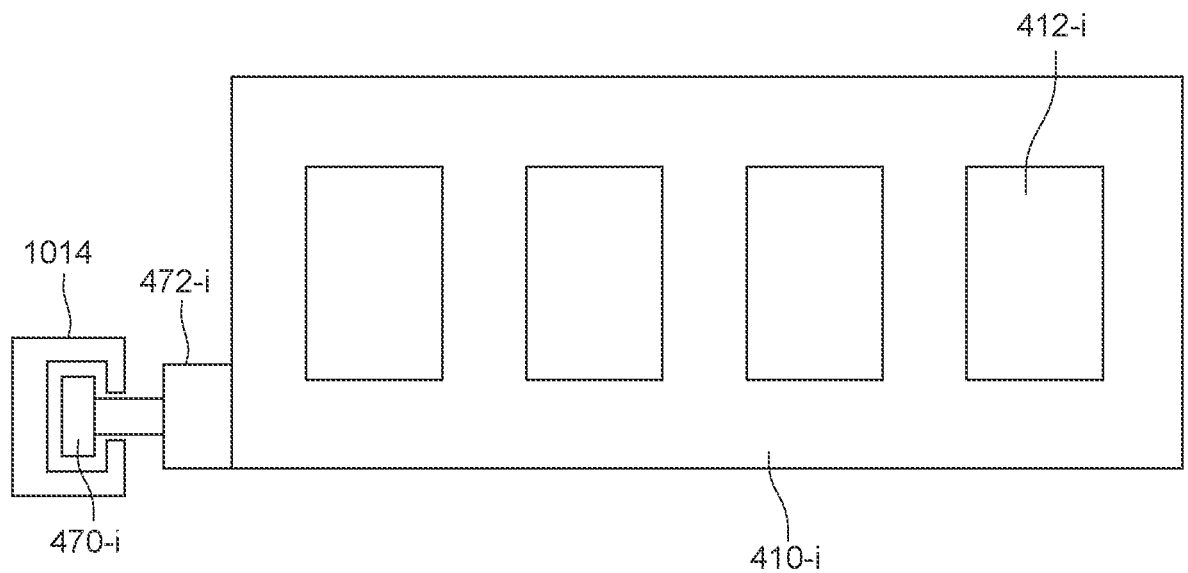
Figure 13D:
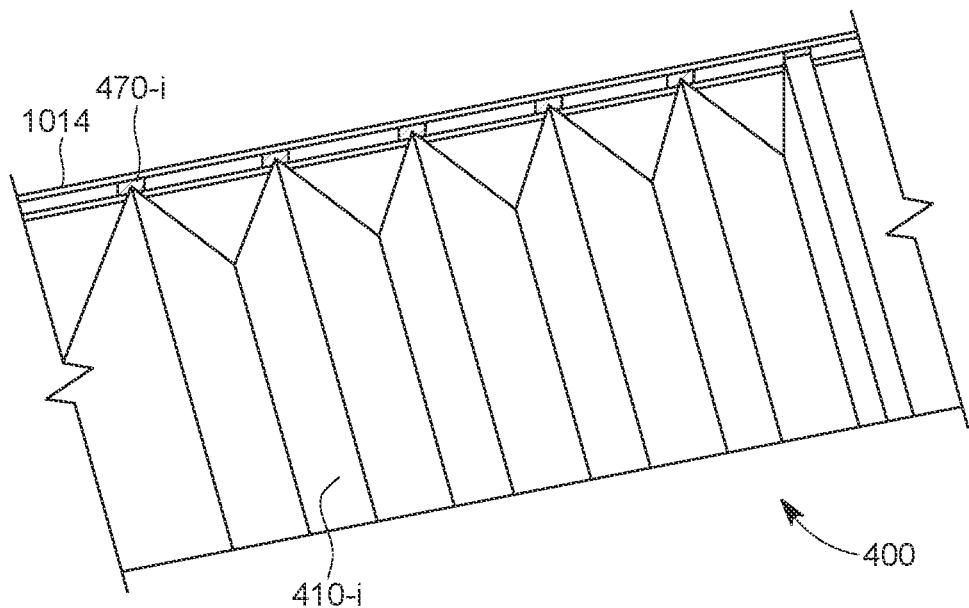

FIGS. 13A to 13D illustrate one implementation of the folding mechanism 440. FIG. 13A shows one fold 410-*i* having plural PV cells 412-*i*. On each side of the fold 410-*i* is attached a bracket 472-*i*, which is connected to the wheel 430-*i* shown in FIG. 10. FIG. 13A also shows the rail 1014 and how it encloses the wheel 430-*i*. FIG. 13B shows that the bracket 472-*i* is centrally connected to the fold 410-*i*, while FIG. 13C shows that the bracket is connected to a side of the fold. FIG. 13D illustrates the PV system 400 being partially folded and also shows the wheels or boots 430-*i* being attached to the rail 1014.

Figure 14A:
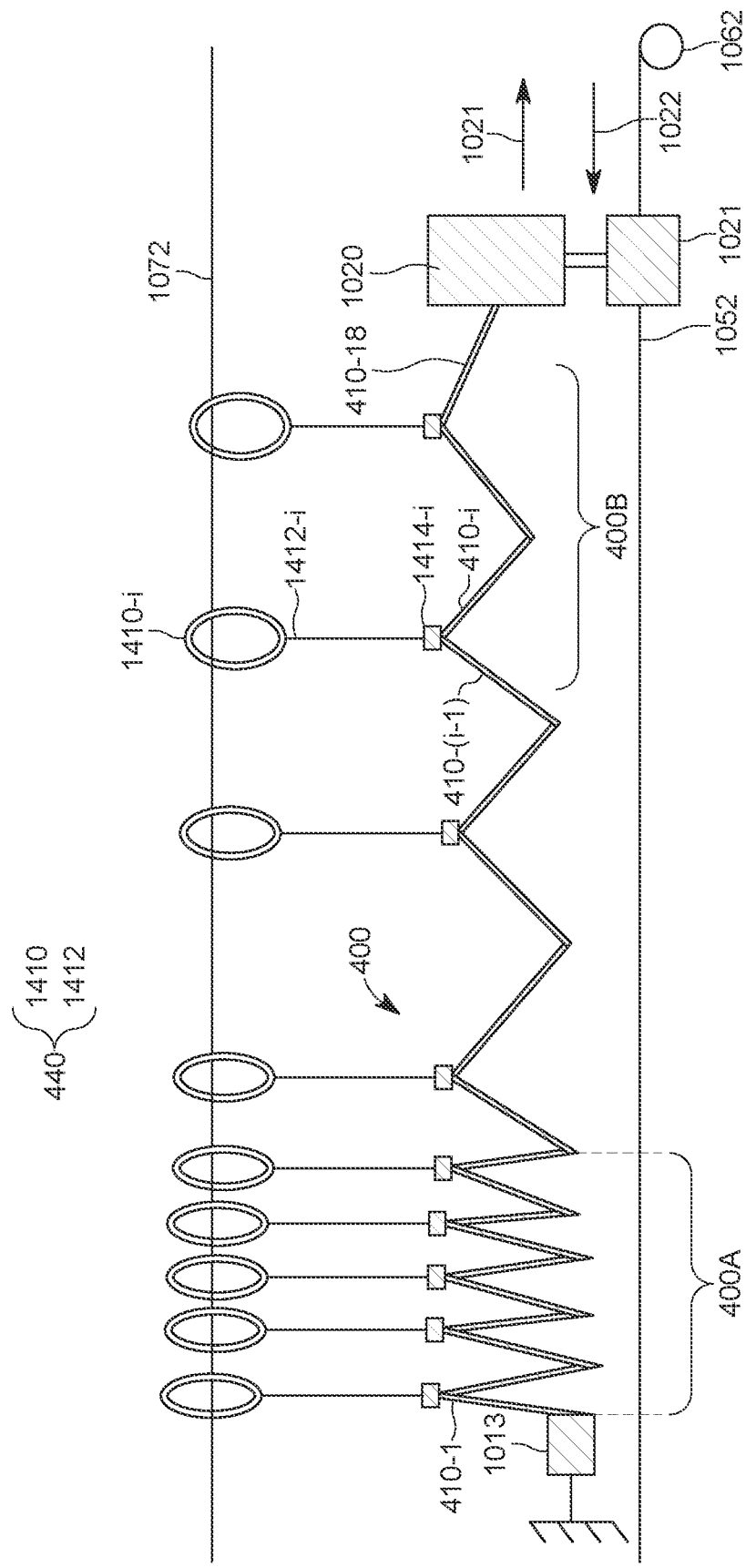
FIGS. 14A and 14B illustrate a PV system attached horizontally to a folding mechanism.
Figure 14B:
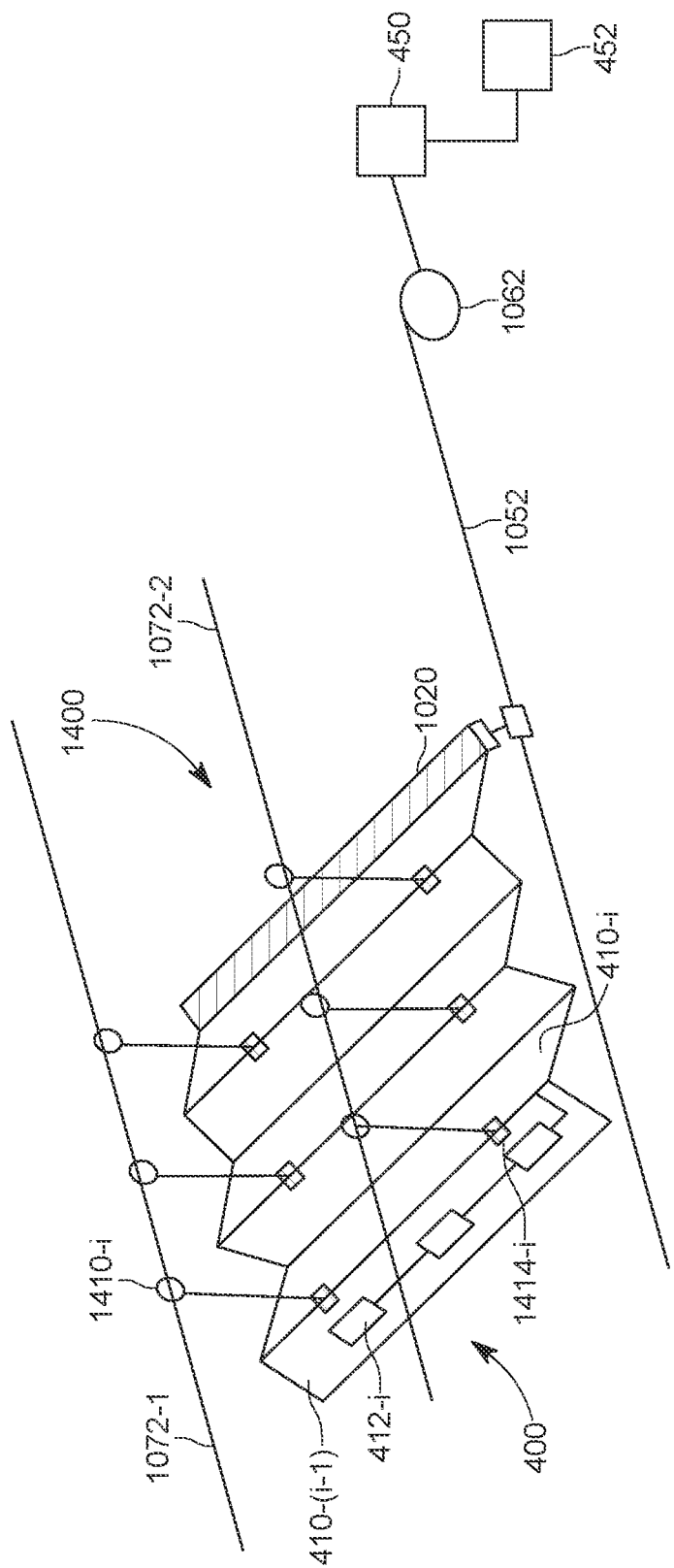

The folding mechanism 440 may be also implemented as illustrated in FIGS. 14A and 14B. The folding mechanism 440 in this embodiment includes a supporting cable 1072 that extends along the structure to be fitted with the PV system 400. Plural connecting rings 1410-*i* (or other shapes, for example, hooks) are distributed along the supporting cable 1072 and are linked to a corresponding suspending cable 1412-*i*. Each suspending cable 1412-*i* is linked to a corresponding connector 1414-*i*. Each connector 1414-*i* is attached to a pair of folds 410-*i* and 410-(*i*−1). Each pair of folds includes two adjacent folds. The pair of folds can fold or unfold depending on the positions of the rings 1410-*i* along the supporting cable 1072. FIG. 14A shows a part 400A of the PV system 400 being still folded while another part 400B of the PV system being mostly unfolded. An end of a first fold 410-1 is attached to a fixed bar 1013 while an end of a last fold 410-18 is attached to the pulling bar 1020. The pulling bar 1020 is attached through a connector 1021 to a moving cable 1052, which is actuated by motor 1062. Depending on the rotation direction of the motor 1062, the pulling bar 1020 can be moved along direction 1021 to unfold (open) the PV system 400 or along direction 1022 to fold (close or retract) the PV system 400.

FIG. 14B shows a bird view of the retracting system 1400, having the PV system 400 partially open. In this embodiment, there are two supporting cables 1072-1 and 1072-2 that support the entire PV system 400 and the pulling bar 1020 moves along the moving cable 1052. FIG. 14B also shows the controller 450 and the corresponding sensor 452. While FIGS. 14A and 14B show the PV system 400 being disposed in a horizontal position, it is also possible that the PV system 400 is attached to the rings 1410-*i* in a vertical configuration, like the vertical blinds of a window.

Figure 15A:
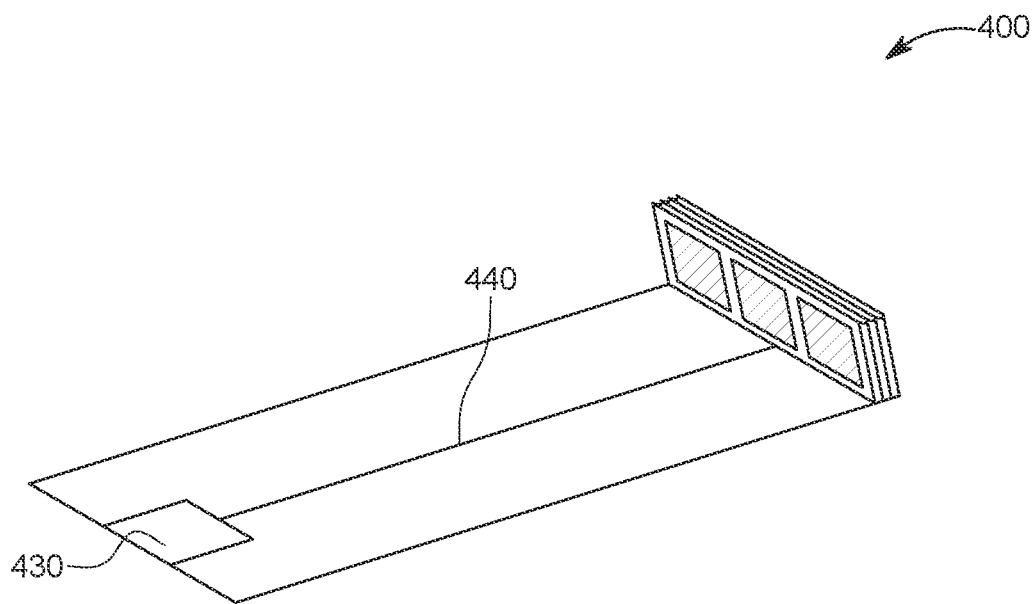
FIGS. 15A to 15D illustrate the PV system at various stages during folding and unfolding.
Figure 15B:
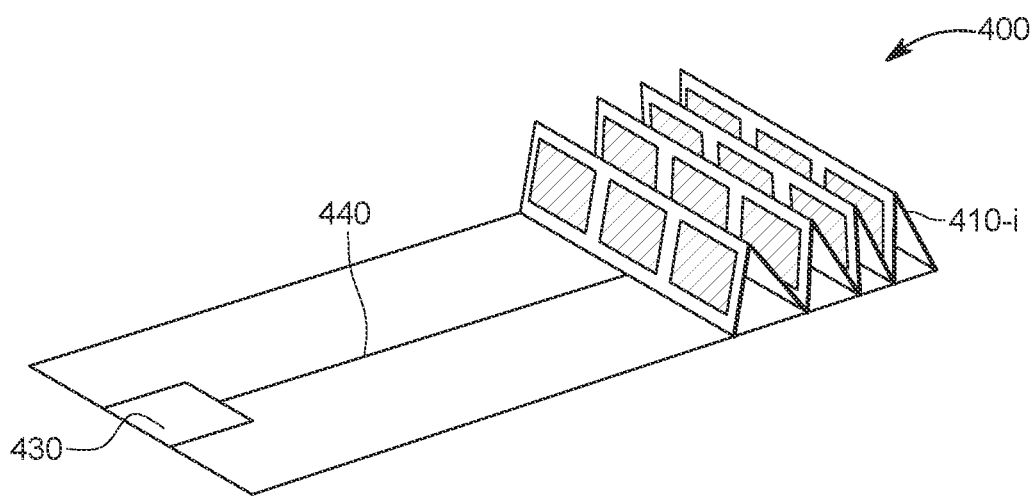
Figure 15C:
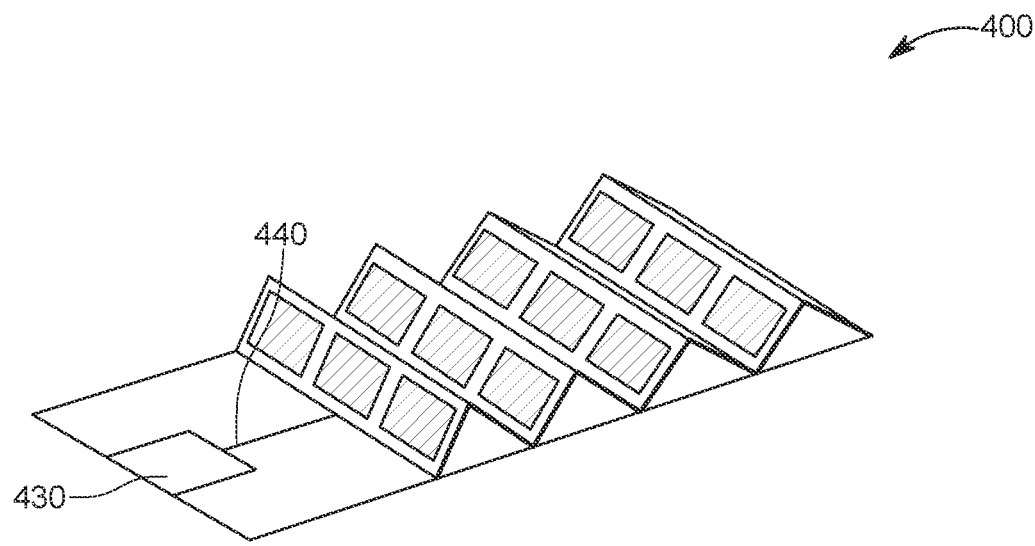
Figure 15D:
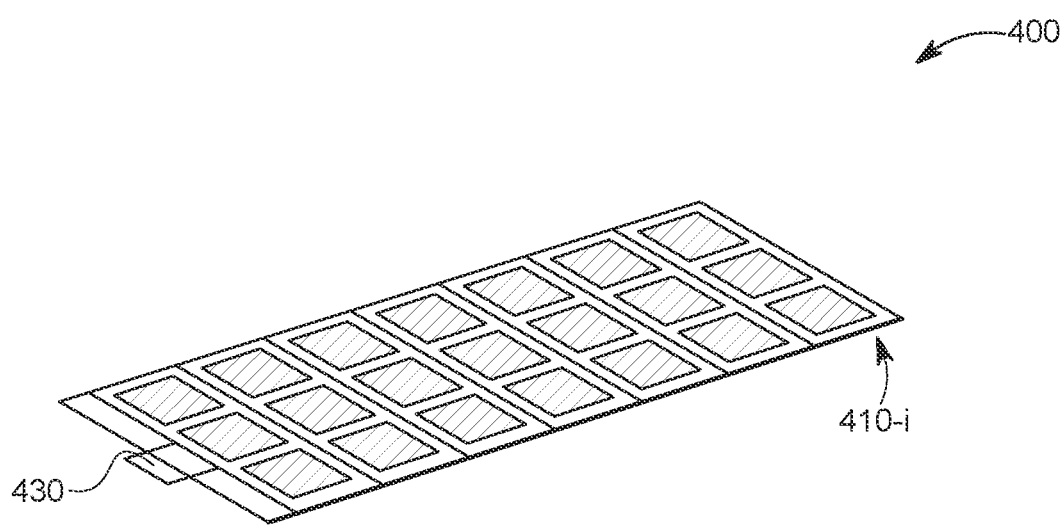

Irrespective of which actuation and folding mechanisms are selected, the PV system 400 (or 900) can be controlled to provide full transparency (no shadow) and no electrical energy generation, as illustrated in the retracted state in FIG. 15A, partial transparency and partial shadow with partial electrical energy generation as illustrated in FIGS. 15B and 15C, and maximum shadow and maximum electrical energy generation, as illustrated in the open state in FIG. 15D. The controller 450 (not shown in these figures) can control the PV system 400 to achieve any desired transparency and electrical energy generation between the two states: open state (or unfolded) and retracted state (or folded), as now discussed. Note that the length of the PV system 400 may be modified (extended or shortened) by the addition or removal of folds 410-*i*. Thus, the length of the PV system 400 may be customized for any structure.

Figure 16:
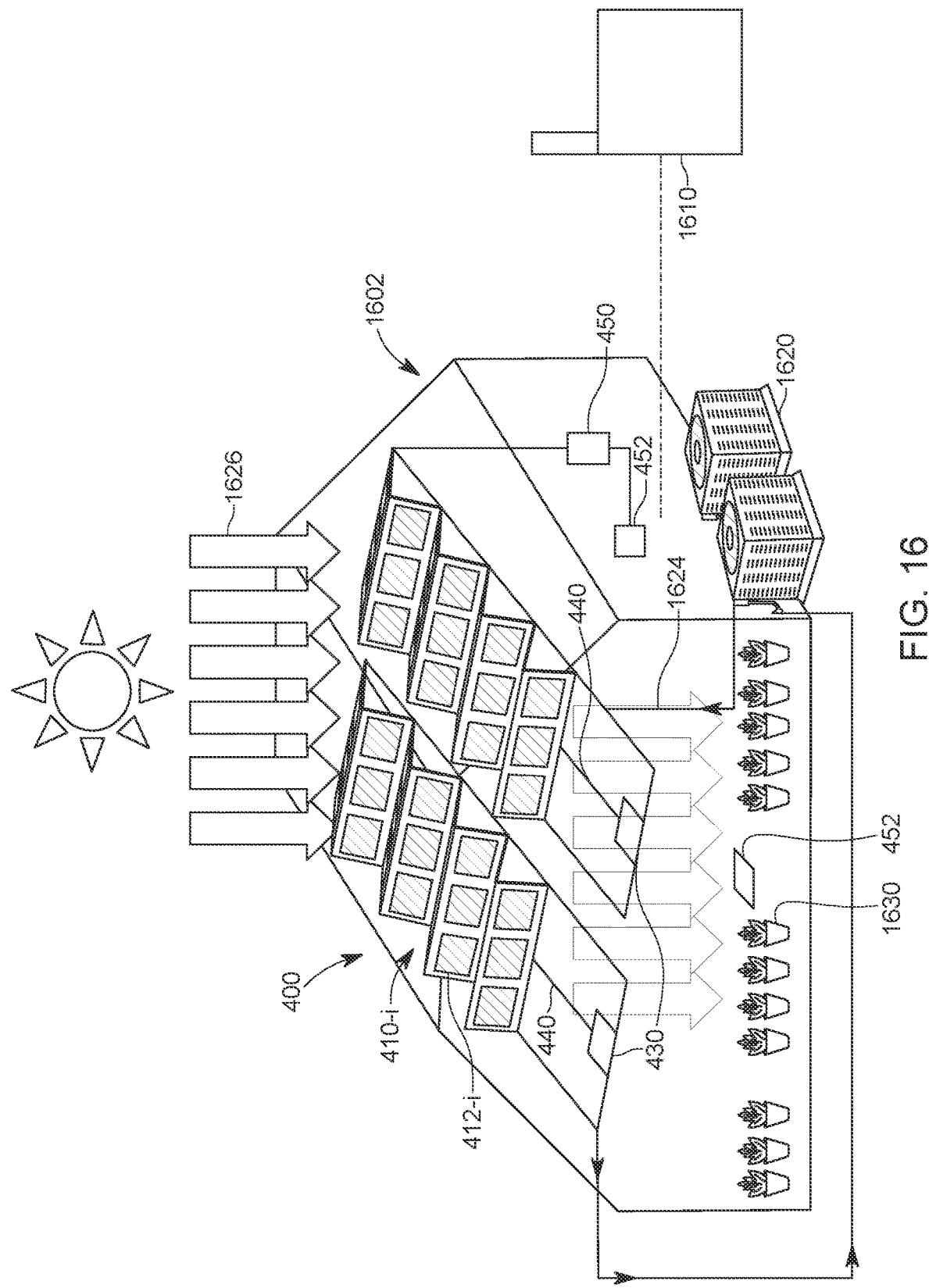
FIG. 16 illustrates a PV system located on the roof of a greenhouse.

FIG. 16 illustrates the PV system 400 deployed on the roof of a structure (greenhouse) 1602, and the PV system is partially folded and partially unfolded. The actuation mechanism 430 and the folding mechanism 440 are shown in this embodiment being deployed at the top of the roof. However, the actuation mechanism and the folding mechanism may be deployed at the bottom of the roof or at any other location. FIG. 16 also shows the controller 450 and the sensor 452 being deployed inside the structure 1602. One or more PV systems 400 may be added to the structure 1602. A traditional AC unit 1620 may also be provided to further regulate the temperature inside the greenhouse. The AC unit 1620 may be powered by electrical energy generated by the PV system 400.

Figure 17:
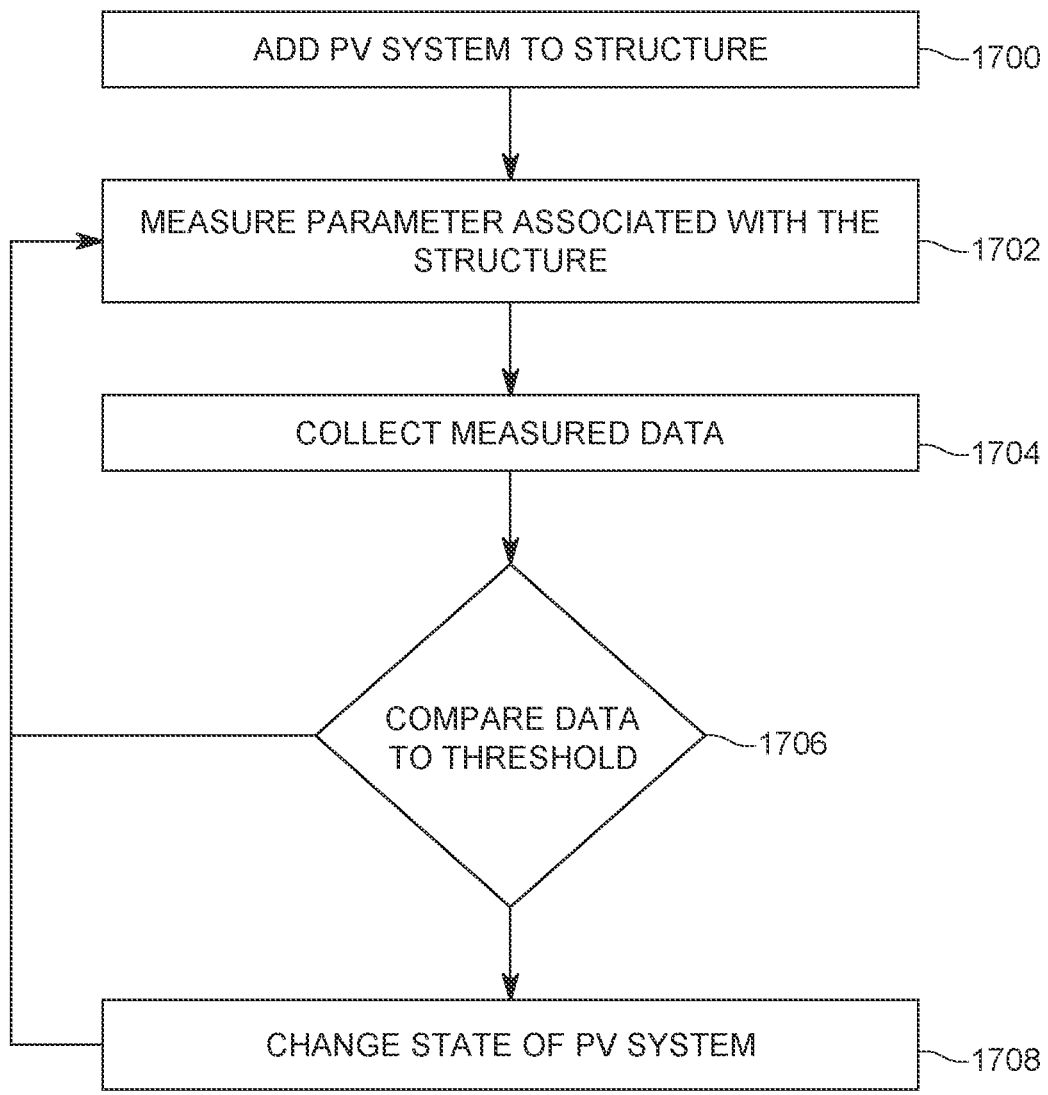
FIG. 17 is a flowchart of a method for controlling the folding of a PV system.

A method for controlling the transparency and/or shadow of the PV system 400 is now discussed with regard to FIG. 17. In step 1700, the PV system 400 (or 900) is provided on the structure 1602. The PV system 400 can be either in a closed state or a retracted state. As previously discussed, the structure 1602 can be any structure. In step 1702, one or more sensors 452 measure information related to the structure, for example, temperature, light level, shading, generated power, wind, etc. If the sensor is a light sensor, the light sensor measures the light 1624 that is shining on the plants 1630 inside the structure. The measured data is electronically collected in step 1704 in a data logger/controller 450 and it can be monitored or set via an application installed on a mobile device 1610. The application can read the data from the data logger 450.

In step 1706, the controller 450 estimates if the measured data is above a given threshold. If the estimation indicates that the parameter is above the given threshold, the controller actuates in step 1708 the actuation and folding mechanisms 430 and 440 and changes the state of the PV system 400 from one of the open or retracted states to another state.

If the parameter is below the given threshold, the method returns to step 1702. After the state of the PV system 400 has changed in step 1708, the method returns to step 1702 to further monitor the parameter. Note that the state of the PV system 400 does not need to fully change from the open state to the retracted state, or vice versa, when the measured parameter has a value above the given threshold. The controller 450 may be configured to gradually change the state of the PV system 400, between the two fully open and fully retracted states. In this way, the PV system 400 is capable of controlling the light 1626 that enters the enclosure and shines on the plants. In other words, the PV system 400 controls the ratio of incident light 1626 on the enclosure and the effective light 1624 that enters the enclosure.

Figure 18A:
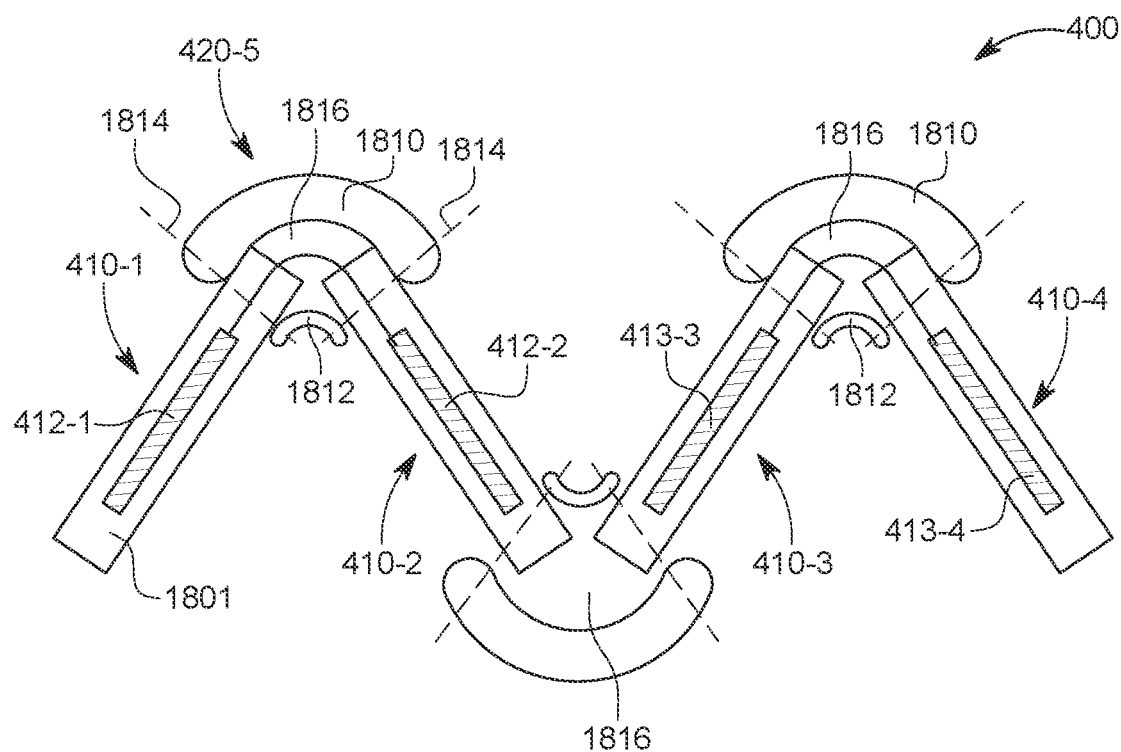
FIGS. 18A to 18C illustrate a flexible connecting mechanism that includes first and second layers having different thickness.
Figure 18B:
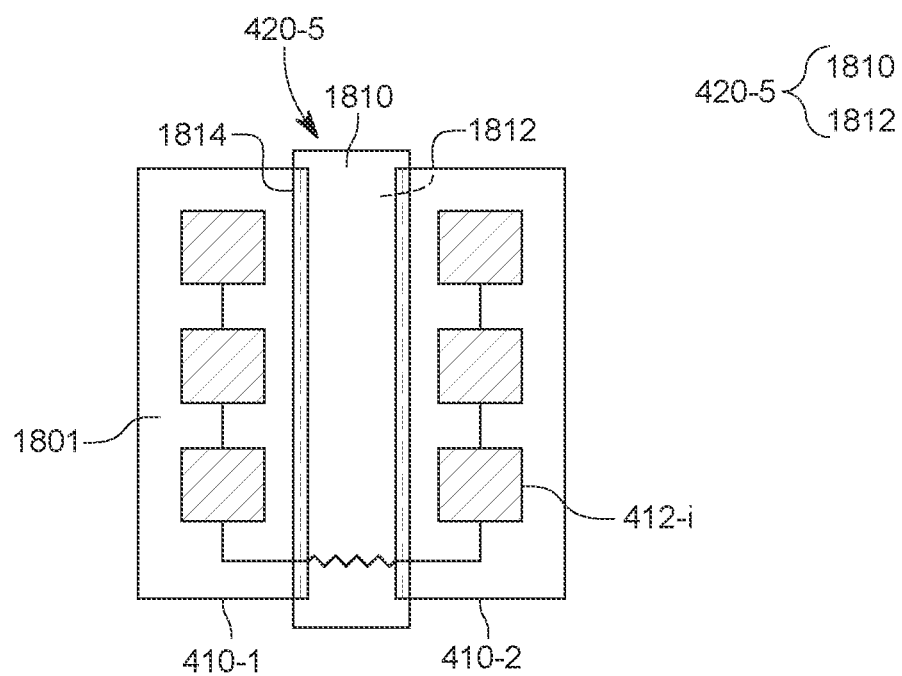

To even better retract and extend the PV system 400, and optionally, to even better control the light and/or air that enter the enclosure on which the PV system 400 is provided, a new connecting mechanism is now discussed according to another embodiment, which is illustrated in FIGS. 18A and 18B. FIG. 18A shows plural PV folds 410-1 to 410-4 connected to each other with a double-layer connecting mechanism 420-5. The double-layer connecting mechanism 420-5 includes a first thick layer 1810 and a second thin layer 1812, each attached to two adjacent PV folds, for example, PV folds 410-1 and 410-2. The two layers 1810 and 1812 may be made of the same or different materials. In this embodiment, the thick layer 1810 is thicker than the thin layer 1812. In one embodiment, a thickness of the thick layer is between 1.1 and 10 times larger than a thickness of the thin layer. Further, in this embodiment the thick layer 1810 forces the two PV folds 410-1 and 410-2 to fold so that the thin layer 1812 is sandwiched between them, and the thick layer 1810 is facing the outside. In other words, the difference in thicknesses between the two layers determines a preferential folding order of the PV folds, which always forces the PV folds to retract in this way. This is also the reason why the thin layer 1812 is thin, i.e., for allowing easy bending when the PV folds are folding.

In one embodiment, the two layers 1810 and 1812 are made of fabric. However, other materials may be used, as, for example, plastic, polymer, or any other bendable material. The two layers 1810 may be made of a transparent material, for example, plastic, or an opaque material, to selectively control the amount of light that passes through the double-layer connecting mechanism. In one application, the two layers 1810 and 1812 are attached with stiches 1814 to each of the PV folds. Other methods for attaching these layers to the PV folds may be used, for example, heat pressing, gluing, etc.

Figure 18C:
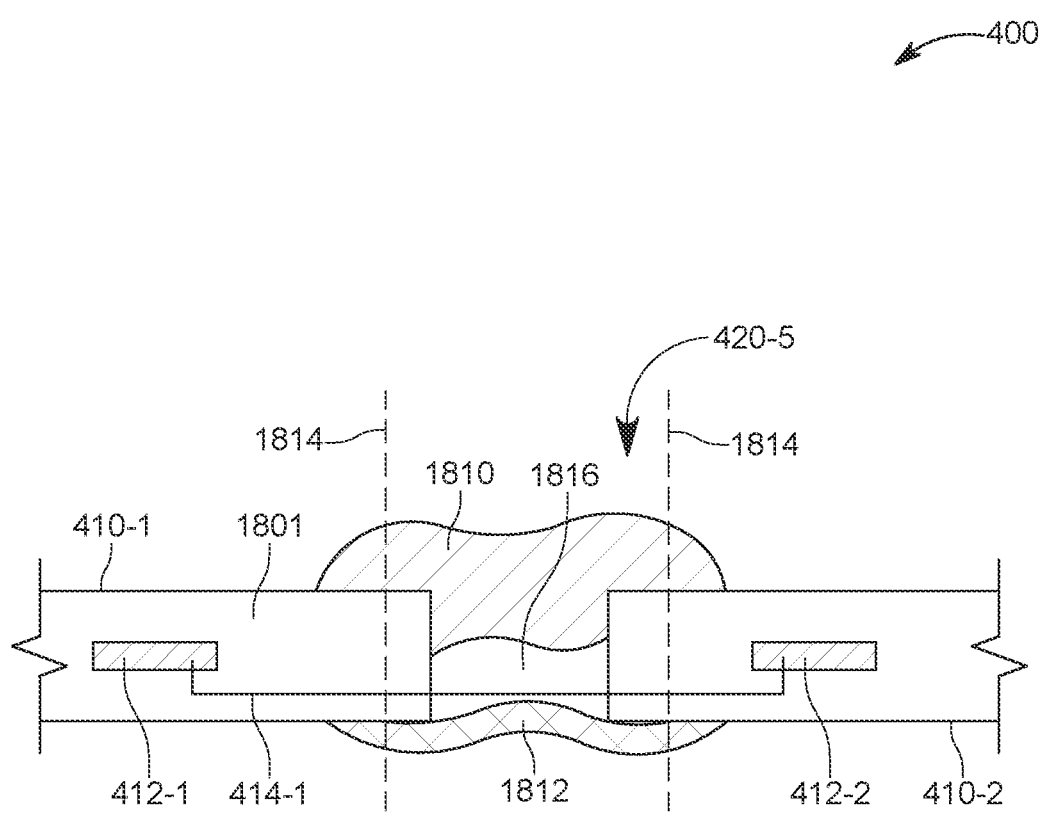

More specifically, as shown in FIG. 18B, the two layers 1810 and 1812 may be stitched to the laminating film 1801 in which the PV cells 412-1 to 412-4 are laminated. Note that FIG. 18A is a cross-section through four PV folds while FIG. 18B is a top view of only two PV folds. More or less PV folds may be connected to each other. Also note that the two layers 1810 and 1812 form a chamber 1816 that is filled with air. FIG. 18C shows the chamber 1816 and the two layers in the unfolded state. This figure shows only two PV folds 410-1 and 410-2 connected with a double-layer connecting mechanism 420-5. This figure also shows the electrical connection 414-1 between the PV cell 412-1 of the PV fold 410-1 and the PV cell 412-2 of the PV fold 410-2. Note that the electrical connection 414-1, which may be implemented as in any of the previously discussed embodiments, is passing through the chamber 1816. In one application, the electrical connection 414-1 is implemented as the metallic flexibly tab connector 640 shown in FIG. 6C, with or without the by-pass diode 644 of FIG. 6E.

Figure 19A:
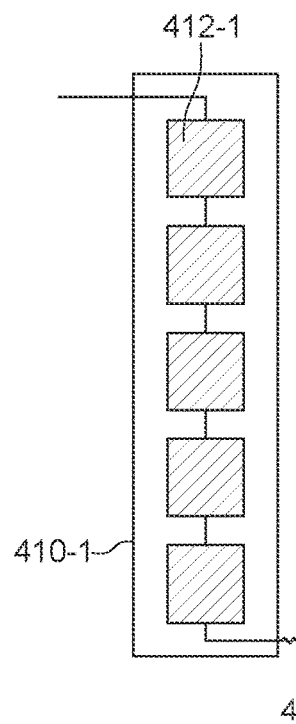
FIGS. 19A to 19C illustrate the steps for attaching two PV folds to each other with a flexible connecting mechanism.
Figure 19B:
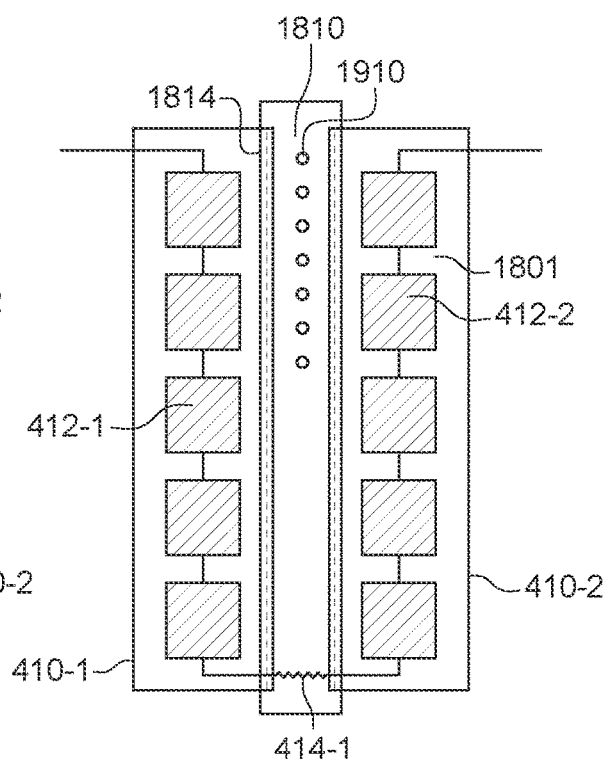
Figure 19C:
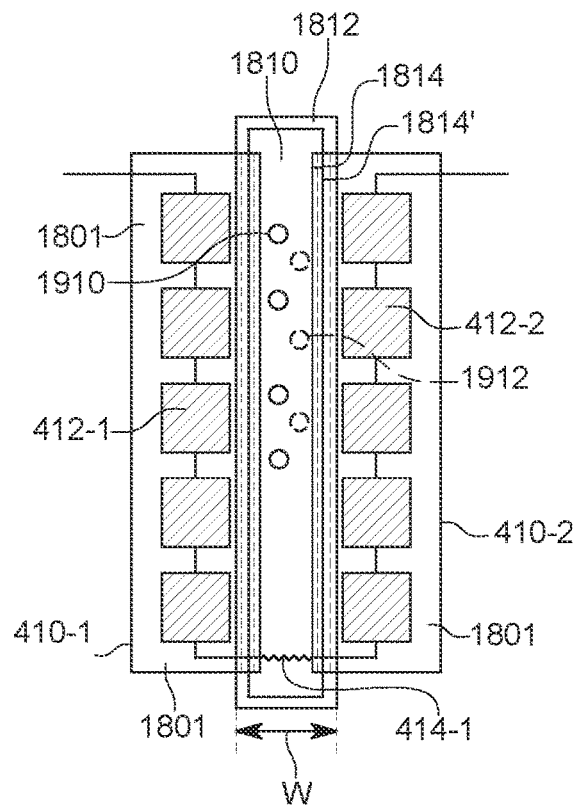

The two layers 1810 and 1812 shown in FIGS. 18A to 18C can be added to the PV folds as now discussed with regard to FIGS. 19A to 19C. First, as show in FIG. 19A, the electrical connection 414-1 is established between the PV cells 412-1 of the first PV fold 410-1 and the PV cells 412-2 of the second PV fold 410-2. In one application, the electrical connection may be implemented as the connecting pad 640, with or without the by-pass diode 644. Then, as shown in FIG. 19B, the thick layer 1810 is placed over the edges of the two adjacent PV folds 410-1 and 410-2 and the thick layer is stitched to each of the two PV folds, with stiches 1814. In this application, the thick layer 1810 is directly attached to the laminating film 1801.

Figure 20:
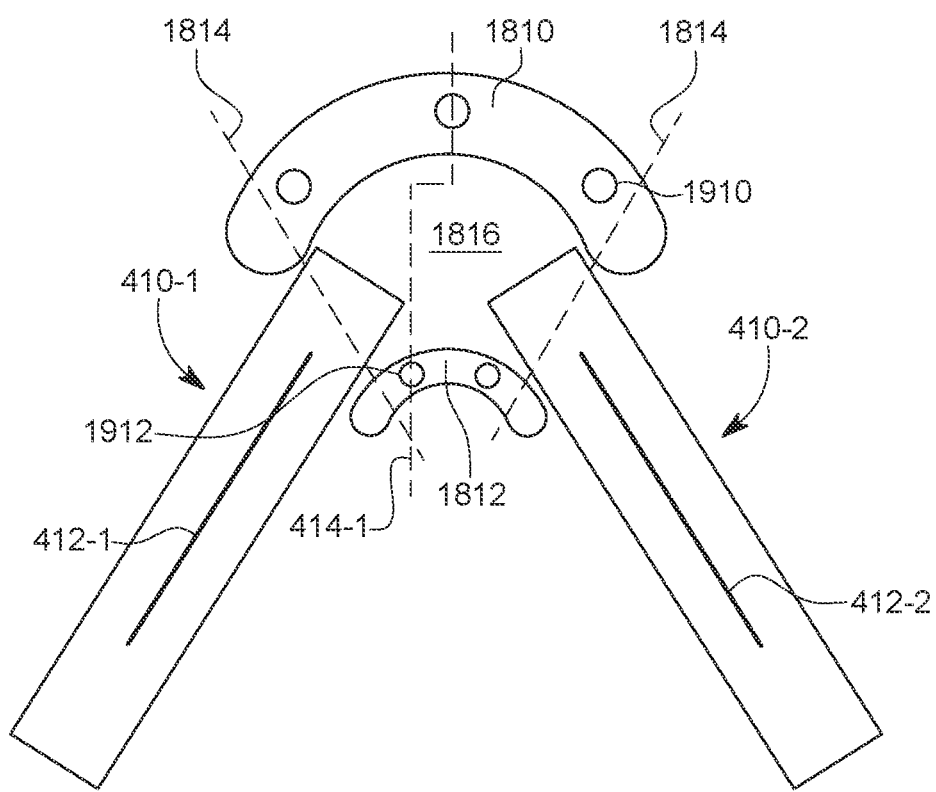

In one embodiment, one or more holes 1910 are formed into the thick layer 1810, for allowing light and/or air to pass through. Then, as shown in FIG. 19C, the thin layer 1812 is added on the other side of the PV folds 410-1 and 410-2 and stitched to the PV folds, for example, directly to the laminating film 1801. FIGS. 19B and 19C show that the thick layer 1810 and the thin layer 1812 are stitched directly to the laminating material 1801 in which the PV cells 412-1 and 412-2 are encapsulated. The thin layer 1812 may have corresponding holes 1912, which are also configured to allow light and/or air to pass through. FIG. 20 shows the holes 1910 and 1912 made into the first and second layers 1810 and 1812, respectively, and also the chamber 1816 through which the electrical connection 414-1, between the two PV folds, extends. In one embodiment, the holes 1910 and 1912 are perfectly aligned. In another embodiment, the holes 1910 and 1912 partially overlap to each other, when the PV folds are unfolded. Still in another embodiment, the holes 1910 and 1912 do not overlap to each other, as shown in FIG. 19C. A width W of the first and second layers 1810 and 1812 may be adjusted for optimal folding.

In one embodiment, the stitching that takes place first in FIG. 19B and then in FIG. 19C may be combined in a single step so that both layers 1810 and 1812 are stitched at the same time to the laminating films of the PV folds 410-1 and 410-2. In other words, it is possible to have individual stitches for each of the first and second layers 1810 and 1812, or just a single set of stitches for both layers. As previously discussed, the material used for the first and second layers 1810 and 1812 may be any material that is capable of being folded.

Figure 21A:
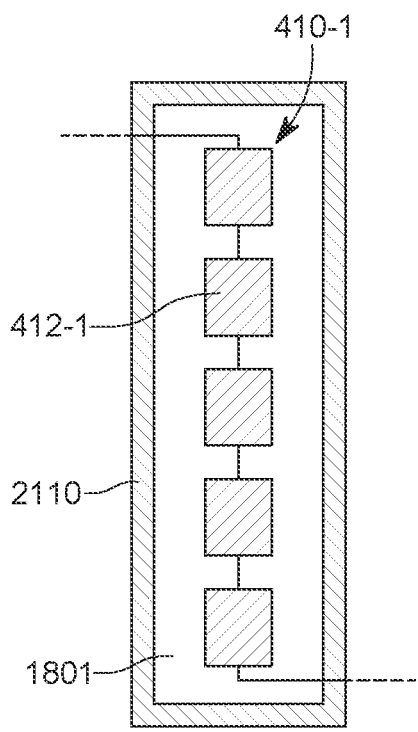
FIGS. 21A to 21C illustrate a PV fold that has one or more of its edges reinforced with another material.
Figure 21B:
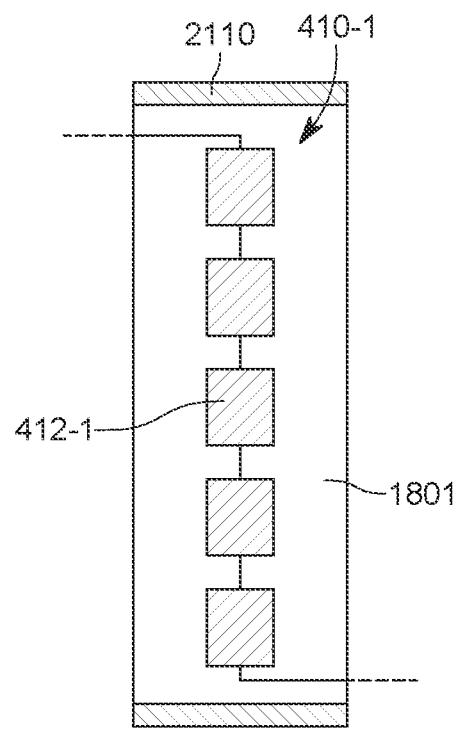
Figure 21C:
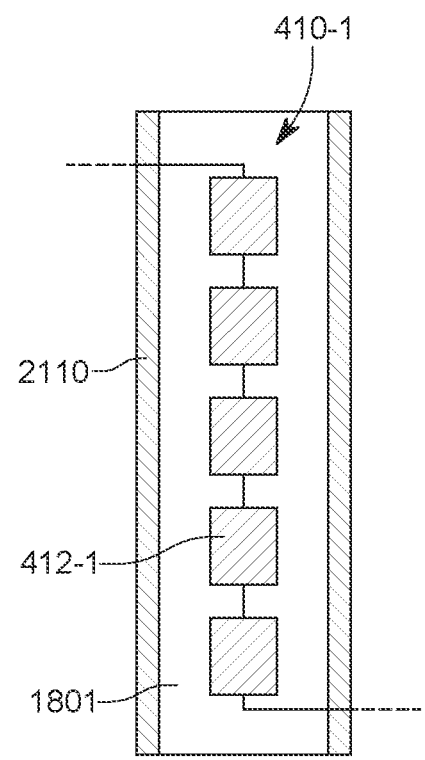
Figure 22A:
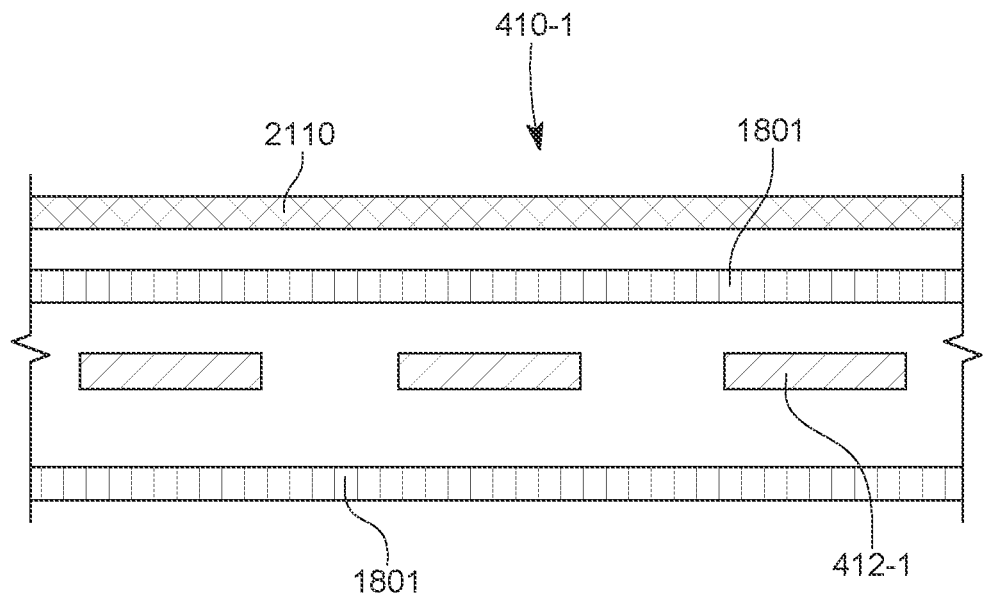
FIGS. 22A and 22B illustrate a cross-section of a PV fold that is reinforced with another material.
Figure 22B:
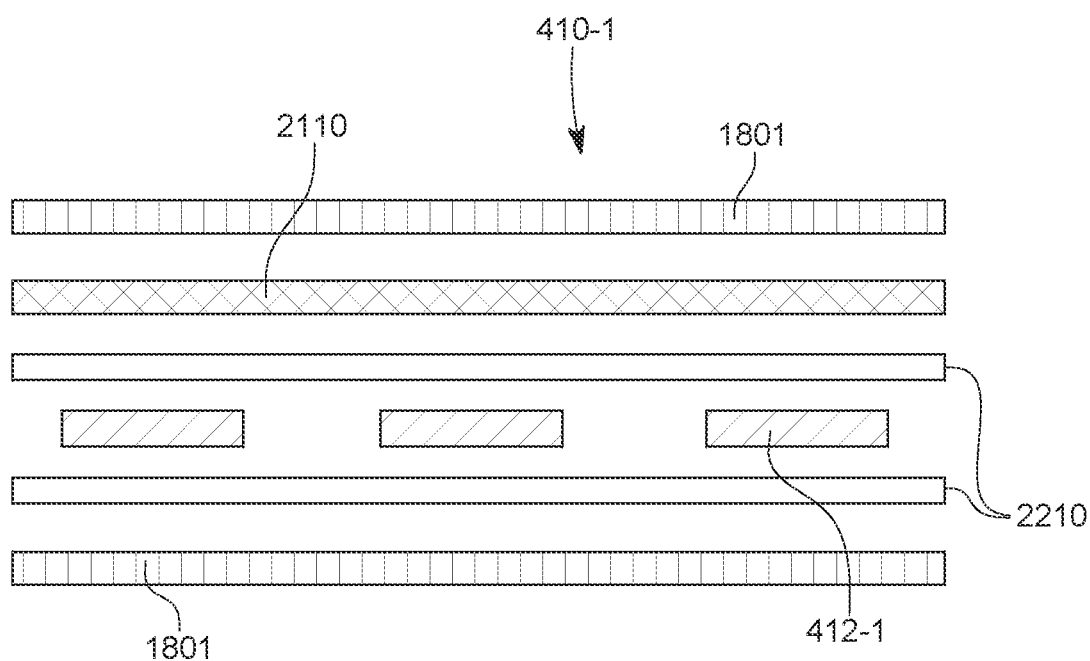

The edges of the PV folds may be reinforced with a more rigid material (e.g., hard plastic, thermoplastic, metal sheet, etc.) prior to being attached to the connecting mechanisms discussed above. For example, as illustrated in FIG. 21A, each edge of a PV fold 410-1 may be reinforced with a rigid material 2110. FIG. 21A shows that in fact the laminating film 1801 of the PV fold 410-1 is reinforced with the rigid material. In one embodiment, as illustrated in FIG. 21B, only the short edges of the PV fold are reinforced with the rigid material 2110. In still another embodiment, as illustrated in FIG. 21C, only the long edges of the PV fold are reinforced with the rigid material 2110. Note that for these embodiments, only after one or more edges of the PV panels are reinforced with the rigid material, the PV panels are attached to each other with the connecting mechanism based on the method previously discussed with regard to FIGS. 19A to 19C. In other words, in some embodiments, the first and second layers 1810 and 1812 may be attached directly to the reinforced material instead of the laminating film 1801. The reinforcing material 2110 may be added on top of the laminating film 1801, as shown in FIG. 22A, or behind the laminating film 1801, between the PV cells and the lamination film 1801, as shown in FIG. 22B. For the embodiment shown in FIG. 22B, an optional filling material 2210 may be placed between the PV cells, to fill the gaps between them.

Figure 23A:
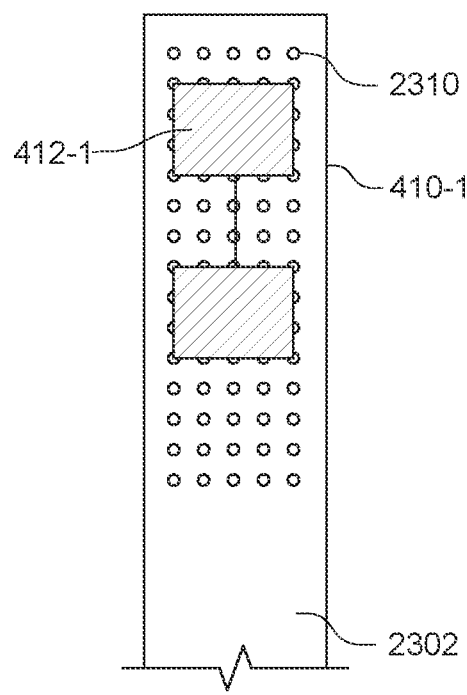
Figure 23B:
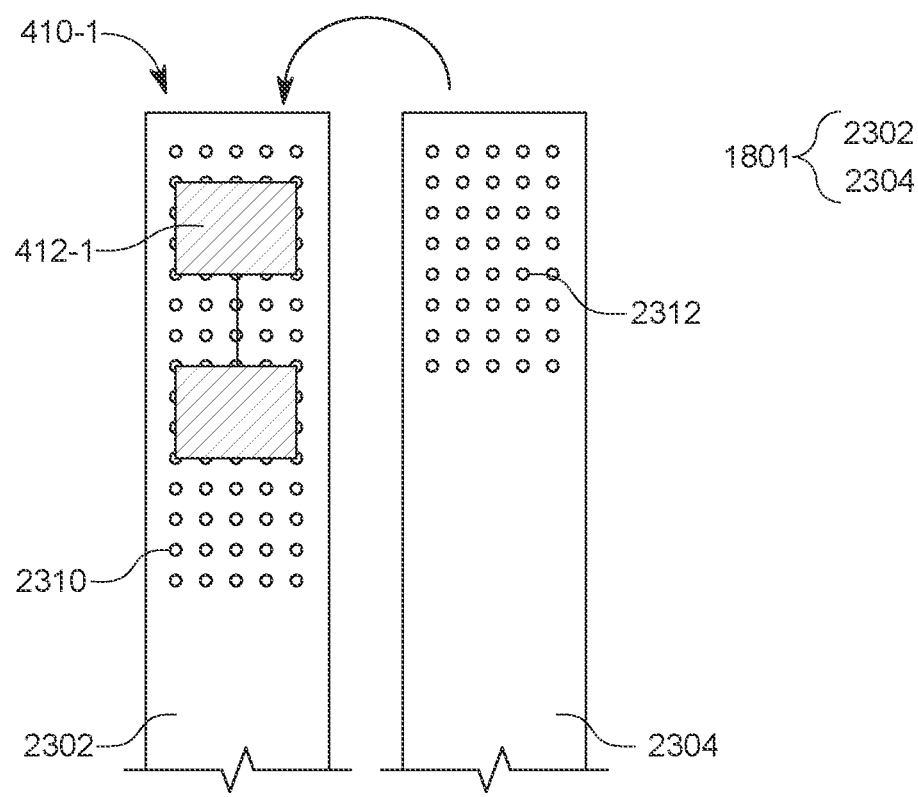

In still another embodiment, as illustrated in FIGS. 23A and 23B, it is possible that the laminating film 1810 itself has holes for air and/or light management. FIG. 23A shows the PV cells 412-1 of a PV fold 410-1 being placed on a first laminating film 2302. The first laminating film 2302 has plural holes 2310. Then, as shown in FIG. 23B, a second laminating film 2304, having its own holes 2312, is added in top of the PV cells 412-1, and the two laminating films 2302 and 2304, when pressed together, form the final laminating film 1801. The holes 2310 and 2312 from the two laminating films are selectively made to overlap with each other so that air and/or light can move through the final laminating film 1801.

Figure 24:
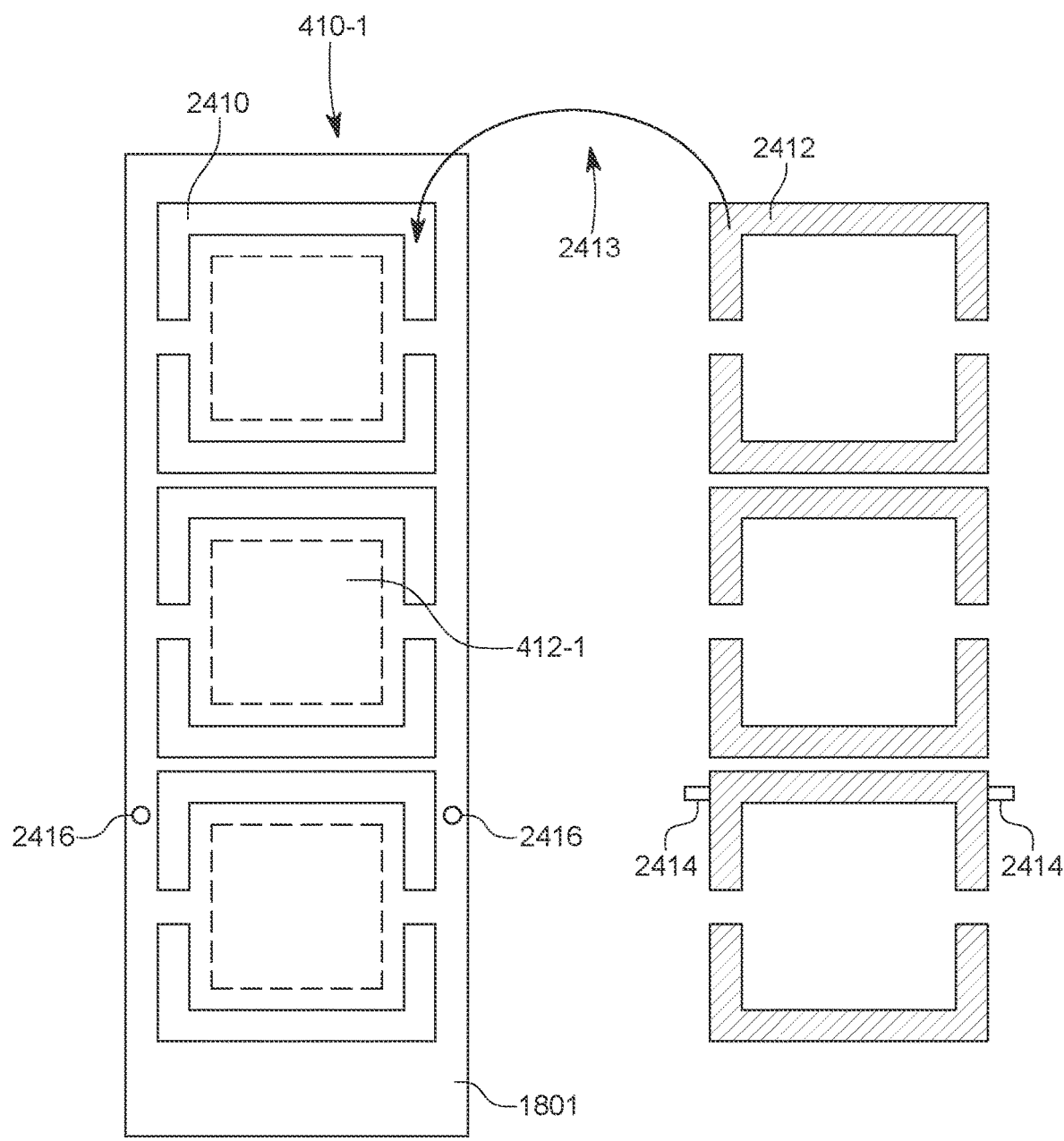
FIG. 24 illustrates a PV fold that has plural apertures into its laminating film.

The laminating film 1801 may be further configured for allowing flexibility in air and/or light management of the PV system 400. For example, as illustrated in FIG. 24, it is possible to have one or more cuts off 2410 (also called apertures, which can have any form or shape) formed into the laminating layer 1801 and corresponding cover parts 2412 that fit into corresponding cuts off 2410, as indicated by arrow 2413. As the laminating film 1801 is transparent to light and not allowing air to pass through, the material for the cover parts 2412 may be selected to be opaque to light and allow the air to pass through (i.e., a breathable material) so that the flow of air and/or light through the PV fold can be controlled depending on the situation. In one application, it is possible that the cover parts 2412 are transparent to light and breathable, or they are opaque and non-breathable.

In one application, the cover parts 2412 are fixedly attached to the laminating film 1801 during the manufacturing process, by using, for example, any known fastening process (e.g., stitching, gluing, welding, etc.). However, in one embodiment, to offer more light and/or air management flexibility, the cover parts 2412 may be formed to have tabs 2414 that are configured to engage and mate with corresponding dots 2416 formed on the laminating film 1801 (i.e., form a snap fastener), so that the cover parts 2412 can be replaced or changed as necessary at the point of usage. In other words, after the PV folds are deployed, for example, on the roof of a greenhouse, it is possible, depending on the season or time of day, to remove some or all the existing cover parts and replace them with other cover parts, that have the same shape, but different air and/or light properties. For example, suppose that during the summer the light is very intense where the greenhouse is located and it is preferred that less light is allowed to pass through the PV folds. For this case, the cover parts 2412 may be selected to be opaque and breathable. However, during the winter season, more light is necessary for the growing plants inside, but cold air is not desired. Then, the operator of the PV folds can replace the existing cover parts 2412 with those that are transparent and non-breathable. In one application, the same PV fold may have different types of cover parts. In still another application, each PV fold has the same type of cover parts, but different PV folds of the PV system 400 have different types of cover parts. One skilled in the art would understand that any possible combination of cover parts and PV folds may be used depending on the need for light and air inside the structure where the PV system is deployed. The tabs 2414 and dots 2416 may in fact not only form a snap fastener, but any male/female mechanism that ensures that the cover parts are removably attached to the laminating film. In one embodiment, these elements may be replaced with a band that is attached over the cover parts, to the laminating film. Any other attachment mechanism may be used.

Figure 25:
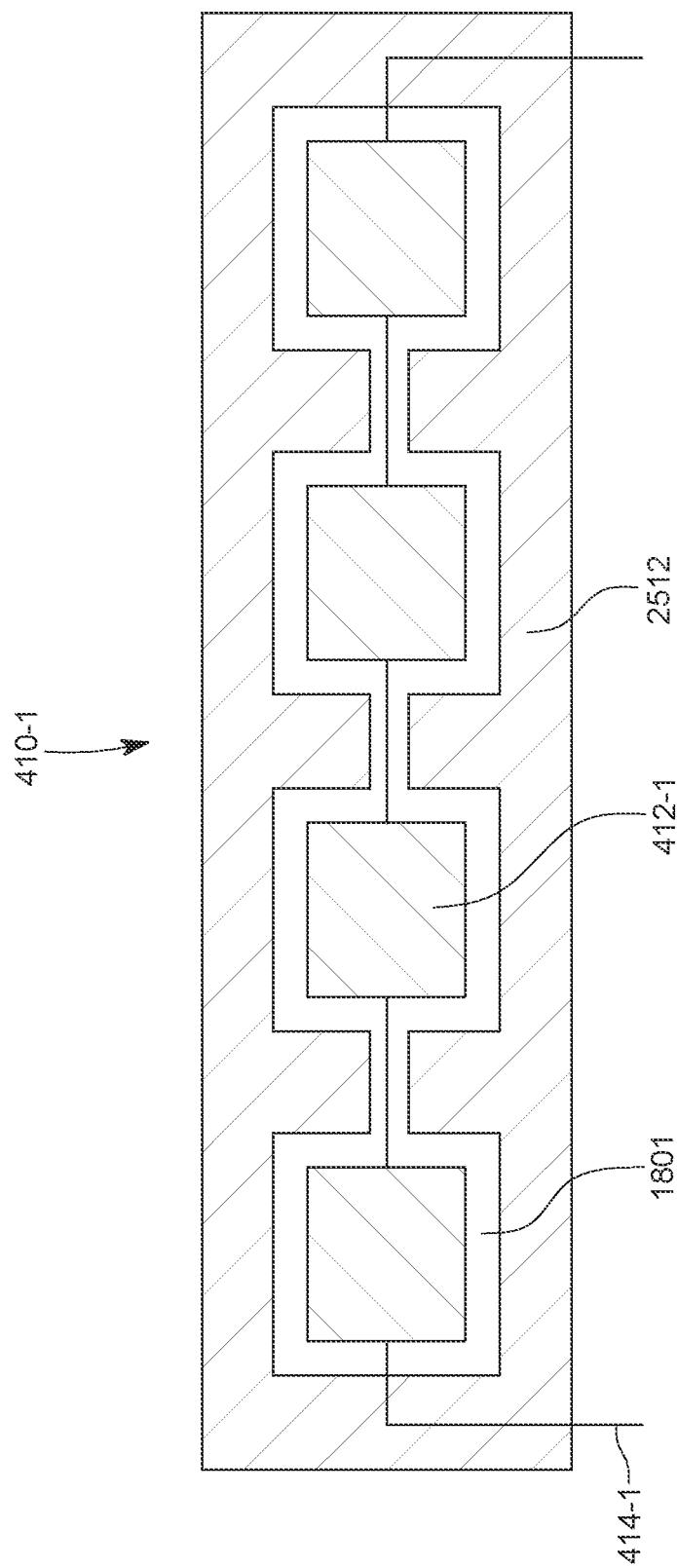
FIG. 25 illustrates a PV fold having another material surrounding its laminating film.

In still another embodiment, as illustrated in FIG. 25, the laminating film 1801 is contoured/shaped around each of the PV cell 412-1 and then, a single cover part 2512 is placed around the entire laminating film 1801 for controlling the light and/or air that passes through each PV fold 410-1. The cover part 2512 may be made of the same materials as the cover parts 2412, depending on the required application. The single cover part 2512 may be removably attached to the laminating film 1801, for example, with a male-female mechanism as discussed with regard to FIG. 24.

Figure 26A:
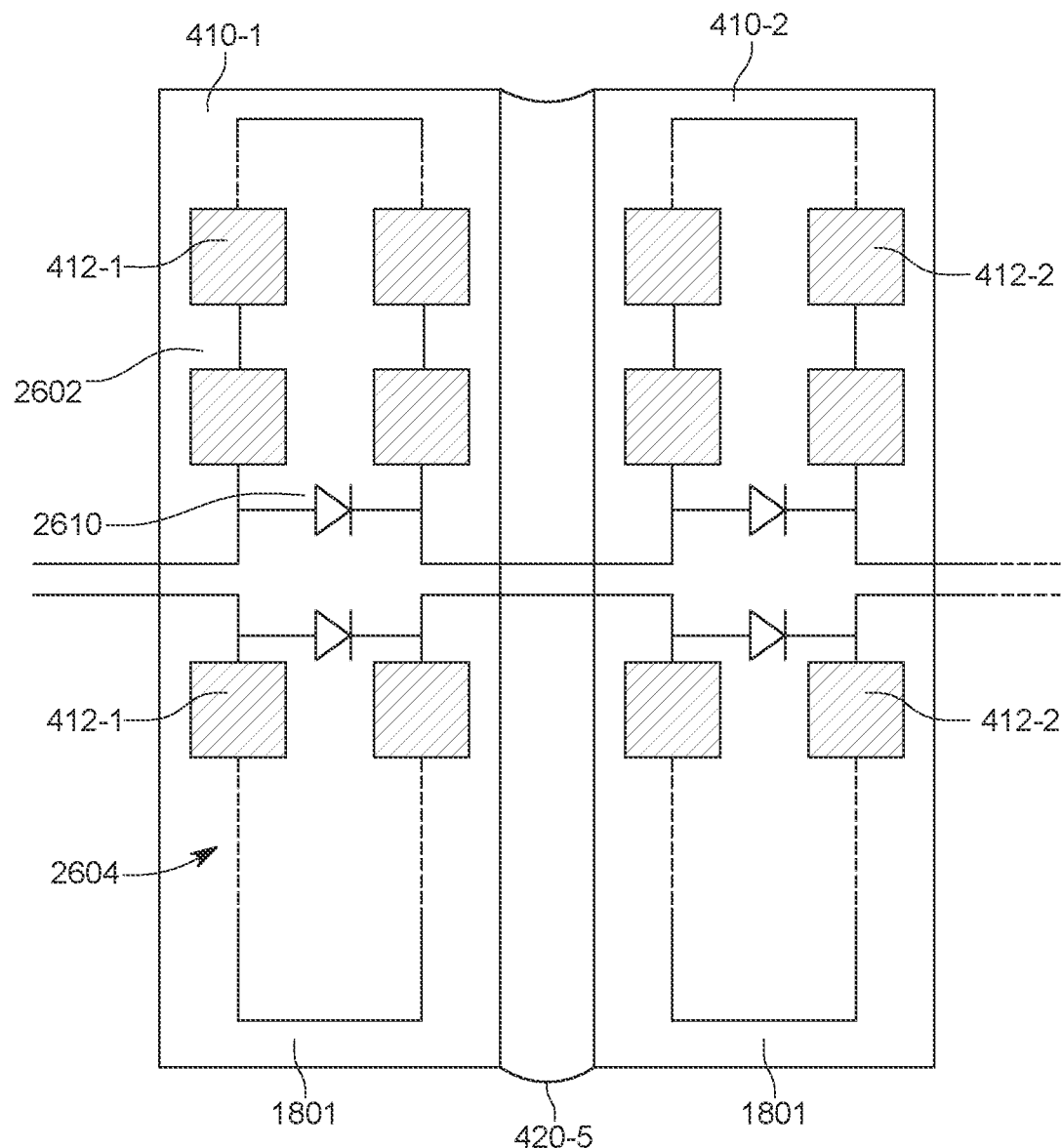
FIGS. 26A and 26B illustrate possible connections of the plural PV cells that form the PV folds.

The plural PV cells 412-$i$ for each PV fold 401-$i$ may be connected to each other in various ways. FIG. 26A shows a first implementation in which all the PV cells 412-1 of the PV fold 410-1 are divided into two sets 2602 and 2604, and the PV cells of each set are connected in series to each other. The ends of each set 2602 and 2604 are connected to a corresponding diode 2610 to form series-connected PV cells for high-voltage applications. This configuration is favorable for large values of solar irradiance.

Figure 26B:
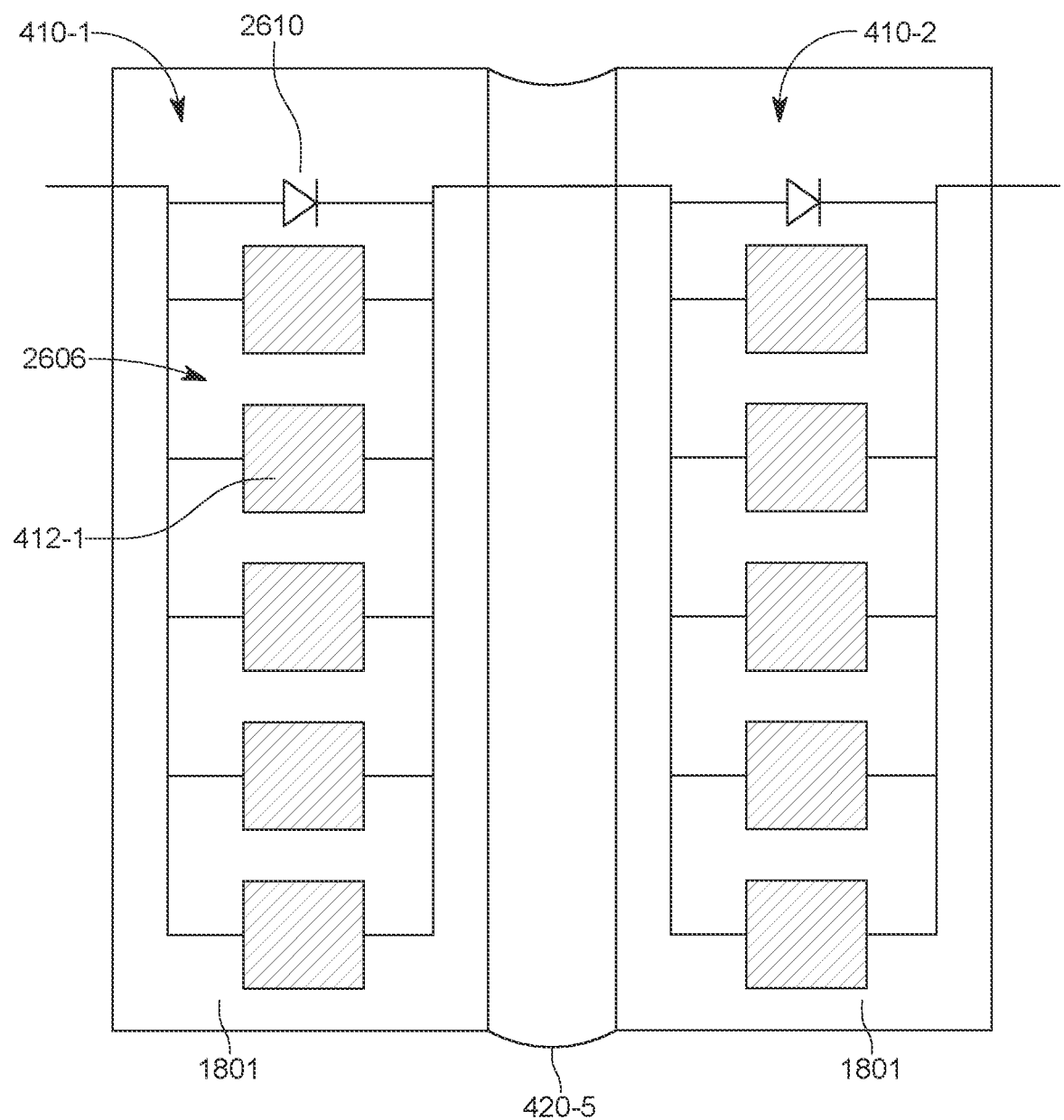

The embodiment shown in FIG. 26B connects all the PV cells 412-1 of a given PV fold 410-1 in parallel and adds the diode 2610 to the ends of each set 2606 of the diodes. These parallel-connected cells are appropriate for current applications for low-solar irradiance. The electrical connections of the PV cells shown in FIGS. 26A and 26B can be implemented for any of the embodiments discussed above, regardless of the choice of connecting mechanism between the PV folds, the type of material/materials used for each PV fold, the reinforced edges, or the holes made in the laminating material.

Further, any of the embodiments discussed with regard to FIGS. 18A to 26B may be implemented in any of the PV systems discussed with regard to FIGS. 1-17, i.e., it is possible to combine any embodiment in this disclosure with any other embodiment or even to combine plural embodiments to obtain the PV fold system 400.

The disclosed embodiments provide a modular dynamically adjustable screen PV system that is retractable so that it can be adjusted between a fully retracted state and a fully open state to control not only an amount of electrical energy that is generated by the PV cells, but to also control an amount of solar light that passes through the PV system and/or a shadow generated by the PV system. The electricity and light/shadow can be used to power and/or control peripheral instrumentation or processes or simply shadowing. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A dynamically adjustable photovoltaic (PV) system for transforming solar energy into electrical energy, the PV system comprising:
    a first PV fold including a first set of PV cells for generating electrical energy, and a first laminating film that encapsulates the first set of PV cells;
    a second PV fold including a second set of PV cells for generating electrical energy, and a second laminating film that encapsulates the second set of PV cells; and
    a connecting mechanism that connects the first laminating film to the second laminating film,
    wherein the connecting mechanism includes a first layer having a first thickness, and a second layer having a second thickness, smaller than the first thickness, the first and second layers defining a chamber.

2. The dynamically adjustable PV system of claim 1, wherein each of the first and second layers is attached to the first and second laminating films.

3. The dynamically adjustable PV system of claim 1, wherein the first and second layers are stitched to the first and second laminating films.

4. The dynamically adjustable PV system of claim 1, wherein the first and second thicknesses of the first and second layers determine a preferential folding direction of the first and second PV folds, so that the second layer is sandwiched between the first and the second PV folds when the first and second PV folds are folded.

5. The dynamically adjustable PV system of claim 1, wherein each of the first and second layers has corresponding holes for allowing air and/or light to pass through the connecting mechanism.

6. The dynamically adjustable PV system of claim 1, wherein one or more edges of the first and second laminating films are reinforced with another material.

7. The dynamically adjustable PV system of claim 1, wherein the first and second laminating films have matching holes for allowing air and/or light to pass through the laminating films.

8. A photovoltaic (PV) fold for transforming solar energy into electrical energy, the PV fold comprising:
    a set of PV cells electrically connected to each other;
    a laminating film that encapsulates the set of PV cells, wherein the laminating film has plural apertures that extend through an entire thickness of the laminating film so that air passes through the laminating film; and
    plural cover parts, each cover part configured to fit into a corresponding aperture in the laminating film,
    wherein the plural cover parts are made of a material different from a material of the laminating film.

9. The PV fold of claim 8, wherein the plural cover parts are removably attached to the corresponding apertures.

10. The PV fold of claim 8, wherein the material of the plural cover parts is transparent to visible light and breathable while the material of the laminating film is transparent to visible light and non-breathable.

11. The PV fold of claim 8, wherein the material of the plural cover parts is not transparent to visible light and breathable while the material of the laminating film is transparent to visible light and non-breathable.

12. The PV fold of claim 8, wherein the material of the plural cover parts is not transparent to visible light and non-breathable while the material of the laminating film is transparent to visible light and non-breathable.

13. The PV fold of claim 8, wherein a first sub-set of the plural cover parts is made of a material different from a material of a second sub-set of the plural cover parts.

14. A dynamically adjustable photovoltaic (PV) system for transforming solar energy into electrical energy, the PV system comprising:
    a first PV fold including a first set of PV cells for generating electrical energy, and a first laminating film that encapsulates the first set of PV cells;
    a second PV fold including a second set of PV cells for generating electrical energy, and a second laminating film that encapsulates the second set of PV cells; and
    a connecting mechanism that electrically connects the first set of PV cells to the second set of PV cells,
    wherein the connecting mechanism has layers of different thicknesses so that is preferentially bendable in one direction and not in an opposite direction so that the first PV fold folds over the second PV fold.

15. The dynamically adjustable PV system of claim 14, wherein the connecting mechanism comprises:
    a metallic layer; and
    a third laminating film that encapsulates the metallic layer.

16. The dynamically adjustable PV system of claim 14, wherein the connecting mechanism comprises:
    a diode; and
    a third laminating film that encapsulates the diode.

17. The dynamically adjustable PV system of claim 14, wherein the connecting mechanism has deformable metal extensions configured to be crimped on corresponding electrical tabs of each of the first and second PV folds.

18. The dynamically adjustable PV system of claim 14, wherein the first set of PV cells is divided into first and second subsets, and each of the first and second subsets of PV cells is connected in series, with a corresponding diode electrically connected between the ends of each subset.

19. The dynamically adjustable PV system of claim 14, wherein each of the first and second set of PV cells is connected in parallel, with a corresponding diode also electrically connected in parallel for each set.

20. A method for dynamically adjusting a surface of a photovoltaic (PV) system, the method comprising:
    attaching the PV system to a structure, wherein the PV system includes a first PV fold including a first set of PV cells for generating electrical energy, and a second PV fold including a second set of PV cells for generating electrical energy;
    measuring a parameter associated with the structure; and
    adjusting, based on the parameter, the surface of the PV system by folding the first PV fold over the second PV fold so that at least one of (1) an electrical energy generation by the PV system, (2) a shade inside the structure, and (3) air penetration inside the structure is adjusted,
    wherein the first PV fold is connected to the second PV fold with a connecting mechanism and the connecting mechanism has layers of different thicknesses so that is preferentially bendable in one direction and not in an opposite direction so that the first PV fold folds over the second PV fold.

* * * * *